(12) United States Patent
Kim et al.

(10) Patent No.: US 11,869,448 B2
(45) Date of Patent: Jan. 9, 2024

(54) DISPLAY DEVICE AND DISPLAY DRIVING METHOD

(71) Applicant: LG DISPLAY CO., LTD., Seoul (KR)

(72) Inventors: Jung-Gyum Kim, Gyeonggi-do (KR); Minsung Kang, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 22 days.

(21) Appl. No.: 17/903,124

(22) Filed: Sep. 6, 2022

(65) Prior Publication Data
US 2023/0178032 A1 Jun. 8, 2023

(30) Foreign Application Priority Data
Dec. 2, 2021 (KR) .................... 10-2021-0170802

(51) Int. Cl.
*G09G 3/3291* (2016.01)
*G09G 3/3266* (2016.01)
*H10K 59/40* (2023.01)
*H10K 59/65* (2023.01)

(52) U.S. Cl.
CPC ......... *G09G 3/3291* (2013.01); *G09G 3/3266* (2013.01); *H10K 59/40* (2023.02); *H10K 59/65* (2023.02); *G09G 2300/0842* (2013.01); *G09G 2310/0278* (2013.01)

(58) Field of Classification Search
CPC ........... G09G 3/007; G09G 2300/0439; G09G 2340/0407; G09G 3/20; H01L 27/3234; G06T 3/4069
See application file for complete search history.

(56) References Cited

U.S. PATENT DOCUMENTS

| | | | |
|---|---|---|---|
| 7,474,319 B2 * | 1/2009 | Allen | G09G 3/007 345/694 |
| 7,675,510 B2 * | 3/2010 | Allen | G09G 3/002 359/275 |
| 2020/0273927 A1 * | 8/2020 | Oh | H01L 27/326 |
| 2021/0175297 A1 * | 6/2021 | Kim | H01L 27/3225 |
| 2021/0360131 A1 * | 11/2021 | Bachar | G09G 3/3208 |

* cited by examiner

*Primary Examiner* — Yuzhen Shen
(74) *Attorney, Agent, or Firm* — POLSINELLI PC

(57) ABSTRACT

A display device includes a display panel in which an optical area and a normal area outside the optical area are formed in a display area, wherein the optical area is divided into a transmission area and a light emitting area and wherein the normal area comprises a plurality of light emitting areas; a gate driving circuit configured to supply a gate signal to the display panel; a data driving circuit configured to convert an image data into a data voltage and supply it to the display panel; a display controller configured to control a movement path of the image data so that at least a part of the image data moves over time according to a structure of the optical area when an area where the image data is displayed includes the optical area.

10 Claims, 20 Drawing Sheets

Left Side View     Front View     Right Side View

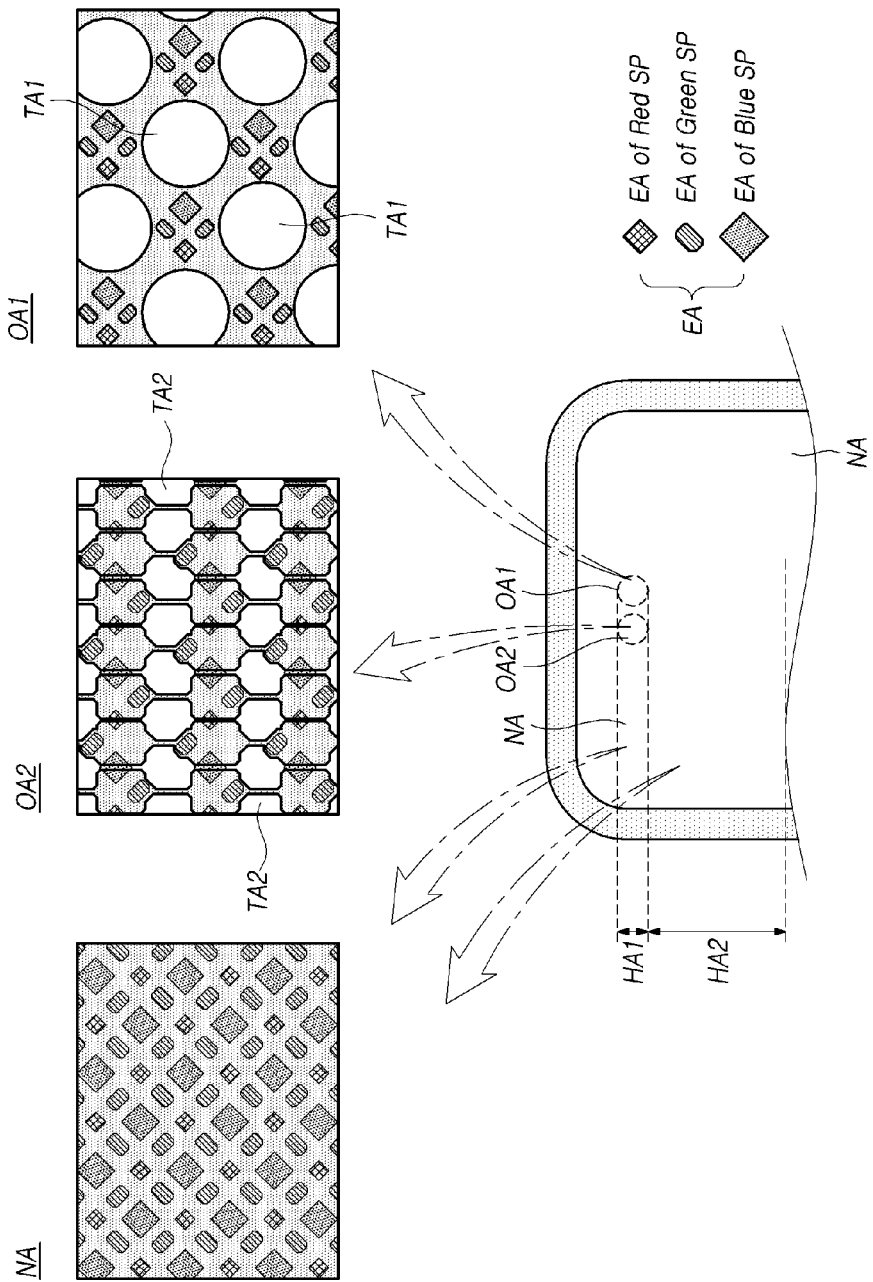

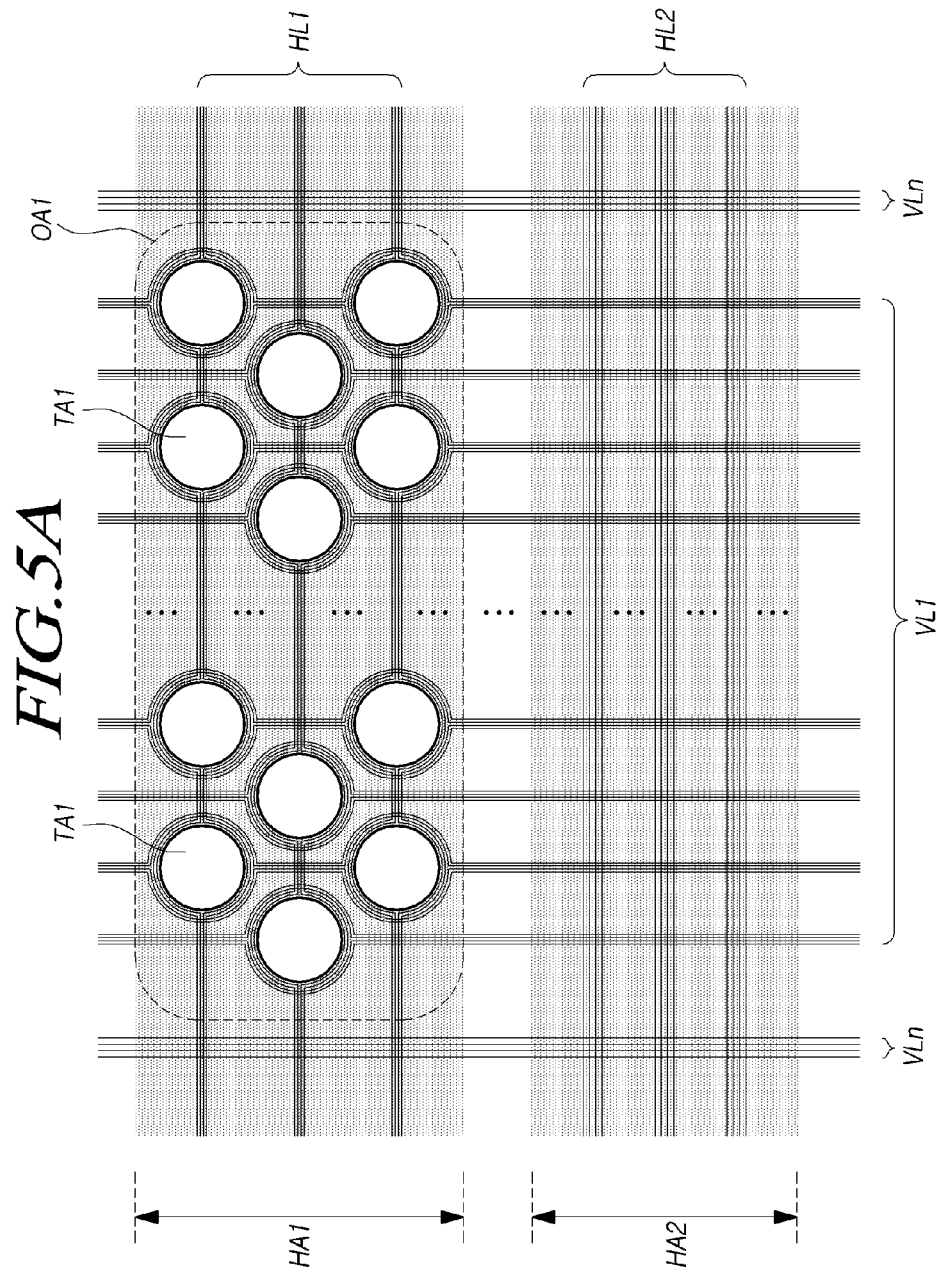

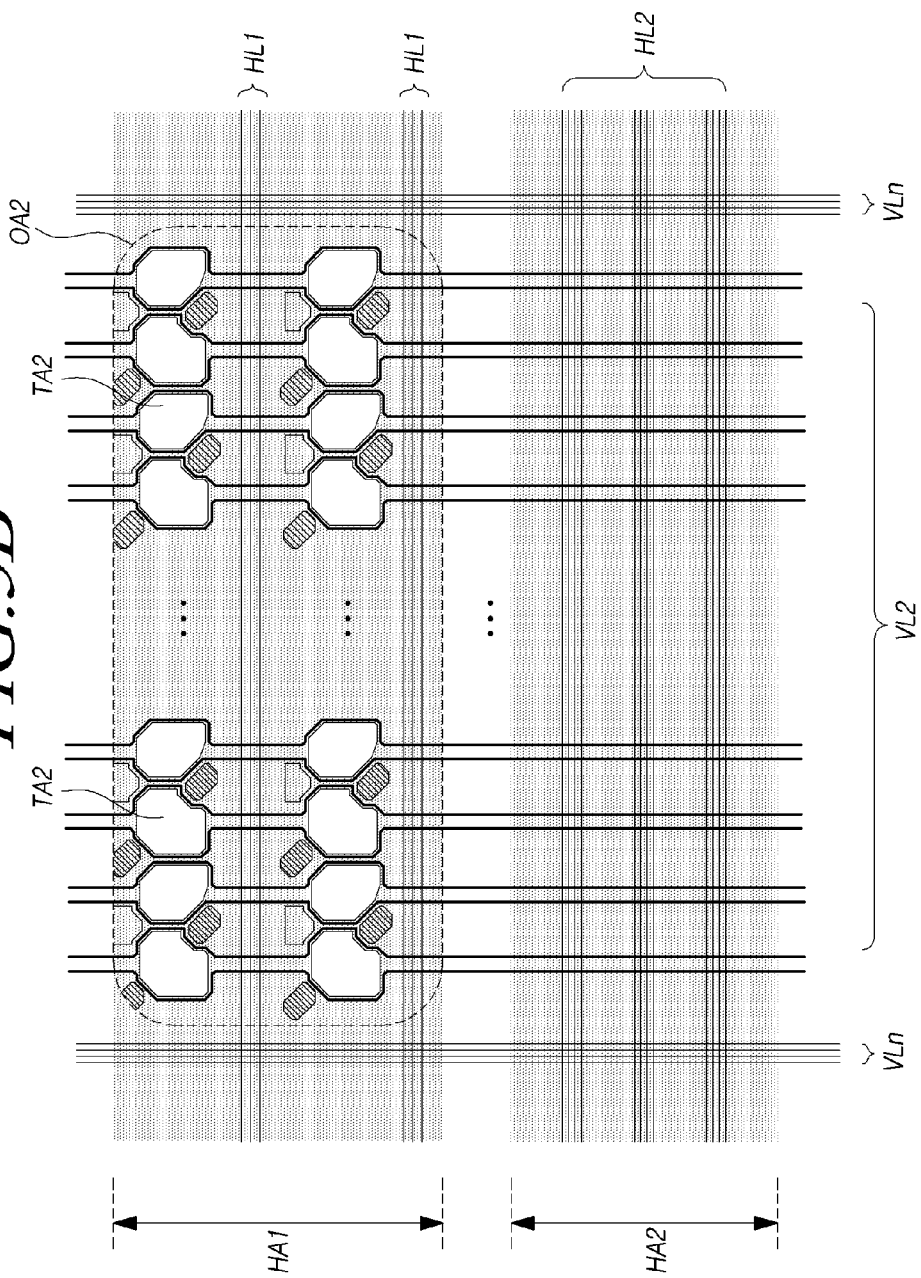

DISPLAY DEVICE AND DISPLAY DRIVING METHOD

CROSS-REFERENCE TO RELATED APPLICATION

This application claims the priority of Korean Patent Application No. 10-2021-0170802, filed on Dec. 2, 2021, which is hereby incorporated by reference in its entirety.

BACKGROUND

Field of the Disclosure

The present disclosure relates to a display device and a display driving method having improved readability.

Description of the Background

With the development of technology, the display device may provide a photographing function and various detection functions in addition to an image display function. To this end, the display device should include an optical electronic device (also referred to as a light receiving device or a sensor) such as a camera and a detection sensor.

Since the optical electronic device needs to receive light from the front side of the display device, it should be disposed where light reception is advantageous. Therefore, the camera (camera lens) and the detection sensor had to be installed so as to be exposed on the front of the display device. For this reason, the bezel of the display panel is widened or a notch is formed or a physical hole is formed in the display area of the display panel, and a camera or a detection sensor is disposed there.

Therefore, as optical electronic devices such as a camera and a detection sensor that perform a predetermined function by receiving light from the front are provided in the display device, the bezel may increase in the front of the display device or there may be restrictions on the front design of the display device.

Accordingly, in the field of display technology, a technology for providing an optical electronic device such as a camera and a detection sensor without reducing the area of the display area of the display panel is being studied.

For example, a technology has been proposed in which an optical electronic device, such as a camera and a detection sensor, is disposed under the display area of a display panel, but uses a partial area of the display area overlapping the optical electronic device as a transmission area in which subpixels are not disposed.

However, when a portion of the display area overlapping with the optical electronic device is used as a transmission area in which subpixels are not disposed, an image corresponding to the transmission area is not displayed and thus a user cannot recognize it.

SUMMARY

Accordingly, the present disclosure is to provide a display device and a display driving method in which a user can recognize an image corresponding to the transmission area while using a partial area of a display area overlapping with the optical electronic device as a transmission area.

More specifically, a display device of the present disclosure has a structure in which a partial area of a display area overlapping with an optical electronic device is used as a transmission area in which subpixels are not disposed, so that a display device and a display driving method can provide improved user readability by moving the image including the transmission area in a certain time unit.

In addition, a display device of the present disclosure has a structure in which a partial area of a display area overlapping with an optical electronic device is used as a transmission area in which subpixels are not disposed, thus providing a display device and a display driving method having improved user readability by moving the image including the transmission area in a certain time unit by reflecting the structure of the light emitting region where the subpixels are disposed and the transmission area where the subpixels are not disposed.

In an aspect of the present disclosure, a display device includes a display panel in which an optical area and a normal area outside the optical area are formed in a display area wherein the optical area is divided into a transmission area and a light emitting area and wherein the normal area comprises a plurality of light emitting areas, a gate driving circuit configured to supply a gate signal to the display panel, a data driving circuit configured to convert an image data into a data voltage and supply it to the display panel, a display controller configured to control a movement path of the image data so that at least a part of the image data moves over time according to a structure of the optical area when an area where the image data is displayed includes the optical area.

In another aspect of the present disclosure, a display driving method for driving a display panel in which an optical area and a normal area outside the optical area are formed in a display area wherein the optical area is divided into a transmission area and a light emitting area and wherein the normal area comprises a plurality of light emitting areas, the method includes a step of detecting a position of an image data displayed on the display panel, a step of determining whether an area in which the image data is displayed includes the optical area, a step of confirming a structure of the optical area, when the area in which the image data is displayed includes the optical area, a step of determining a movement path of the image data according to the structure of the optical area, a step of displaying the image data on the display panel according to the movement path of the image data.

In the present disclosure, a display device and a display driving method are provided in which a user may recognize an image corresponding to the transmission area while using a partial area of a display area overlapping the optical electronic device as a transmission area.

In the present disclosure, a display device and a display driving method having improved readability of a user may be provided by moving an image including the transmission area in a predetermined time unit in a structure in which a partial region of display area overlapped with the optical electronic device is used as a transmission area in which subpixels are not disposed.

In the present disclosure, a display device and a display driving method with improved readability of a user may be provided by moving an image including a transmission area by reflecting a structure of a light emitting area where a subpixel is disposed and a transmission area where a subpixel is not disposed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIG. 4 illustrates arrangements of subpixels in three areas included in the display area of the display panel according to aspects of the present disclosure;

FIG. 5A illustrates arrangements of signal lines in each of a first optical area and a normal area in the display panel according to aspects of the present disclosure;

FIG. 5B illustrates arrangements of signal lines in each of a second optical area and the normal area in the display panel according to aspects of the present disclosure;

DETAILED DESCRIPTION

Figure 1A:
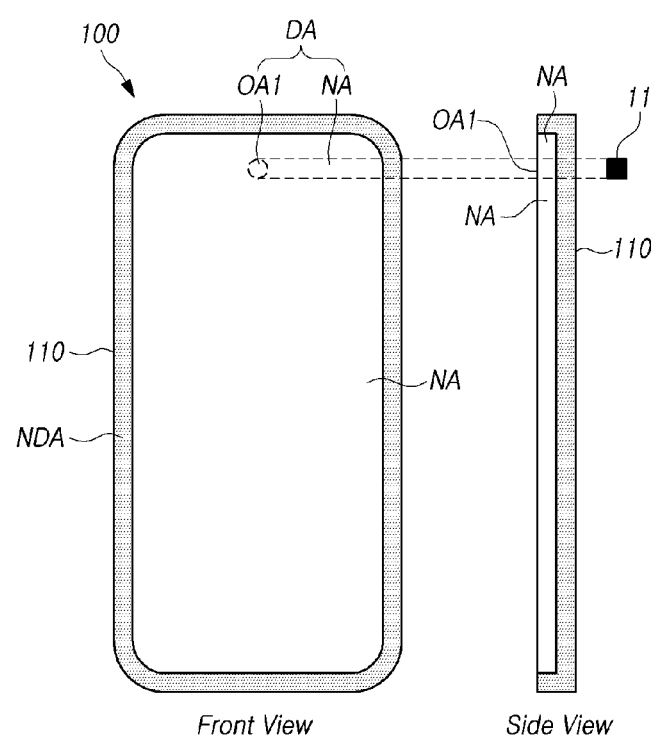
FIGS. 1A, 1B and 1C are plan views illustrating a display device according to aspects of the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various aspects of the present disclosure will be described in detail with reference to the accompanying drawings.

Figure 1B:
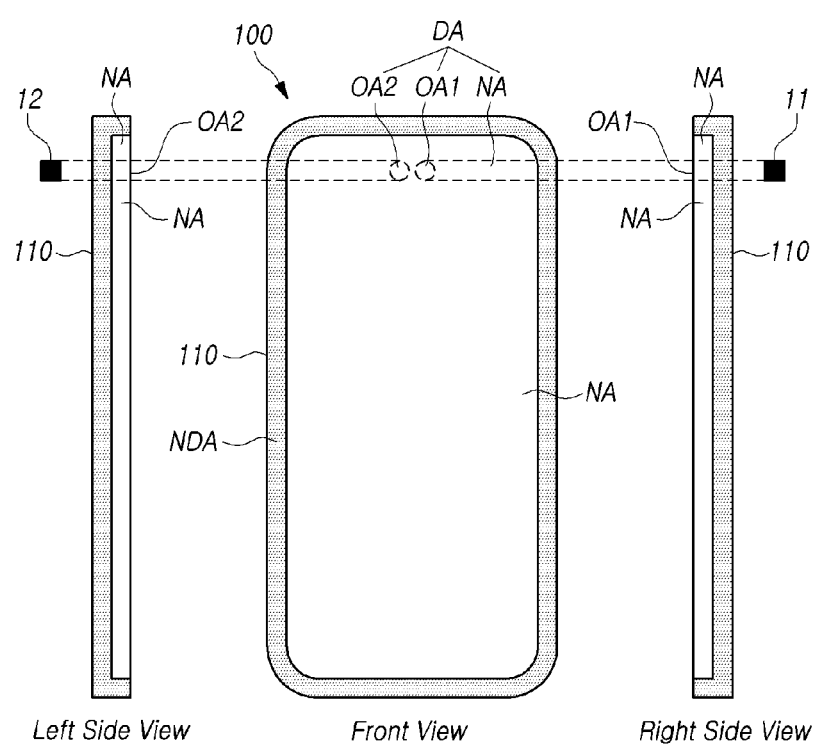
Figure 1C:
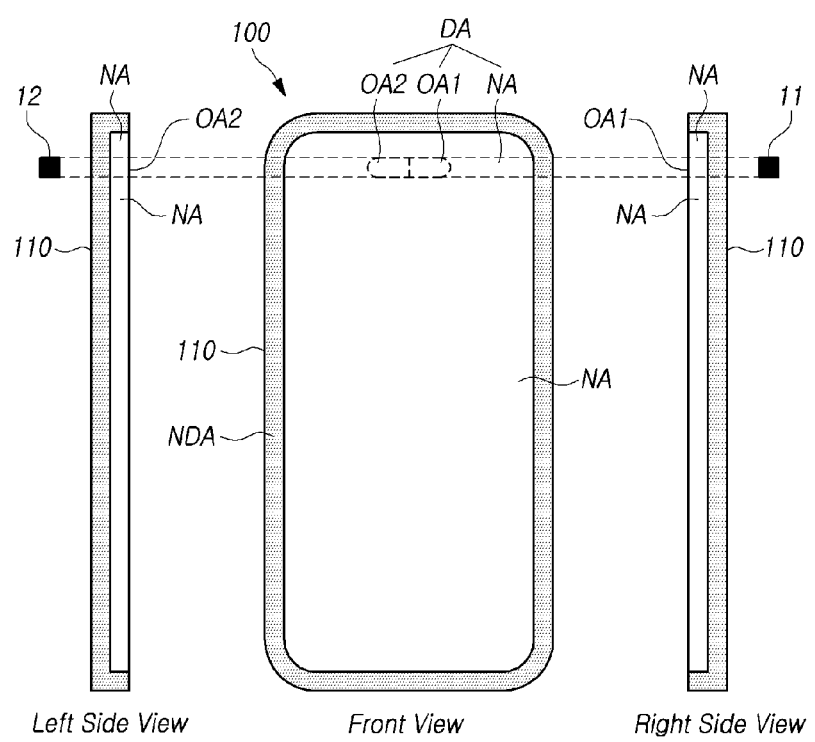

FIGS. 1A, 1B and 1C are plan views illustrating a display device 100 according to aspects of the present disclosure.

Referring to FIGS. 1A, 1B, and 1C, the display device 100 according to aspects of the present disclosure can include a display panel 110 for displaying images, and one or more optical electronic devices 11, 12.

The display panel 110 can include a display area DA in which an image is displayed and a non-display area NDA in which an image is not displayed.

A plurality of subpixels can be disposed in the display area DA, and several types of signal lines for driving the plurality of subpixels can be disposed therein.

The non-display area NDA may refer to an area outside of the display area DA. Several types of signal lines can be disposed in the non-display area NDA, and several types of driving circuits can be connected thereto. The non-display area NDA may be bent to be invisible from the front of the display panel or may be covered by a case (not shown). The non-display area NDA may be also referred to as a bezel or a bezel area.

Referring to FIGS. 1A, 1B, and 1C, in the display device 100 according to aspects of the present disclosure, one or more optical electronic devices 11, 12 may be located under, or at a lower portion of, the display panel 110 (the opposite side to the viewing surface thereof).

Light can enter the front surface (viewing surface) of the display panel 110, pass through the display panel 110, reach one or more optical electronic devices 11, 12 located under, or at the lower portion of, the display panel 110 (the opposite side to the viewing surface).

The one or more optical electronic devices 11, 12 can receive or detect light transmitting through the display panel 110 and perform a predefined function based on the received light. For example, the one or more optical electronic devices 11, 12 can include one or more of an image capture device such as a camera (an image sensor), and/or the like, and a sensor such as a proximity sensor, an illuminance sensor, and/or the like.

Referring to FIGS. 1A, 1B, and 1C, in the display panel 110 according to aspects of the present disclosure, the display area DA may include one or more optical areas OA1, OA2 and a normal area NA.

Referring to FIGS. 1A, 1B, and 1C, the one or more optical areas OA1, OA2 may be one or more areas overlapping the one or more optical electronic devices 11, 12.

According to an example of FIG. 1A, the display area DA may include a first optical area OA1 and a normal area NA. In this example, at least a part of the first optical area OA1 may overlap a first optical electronic device 11.

According to an example of FIG. 1B, the display area DA may include a first optical area OA1, a second optical area OA2, and a normal area NA. In the example of FIG. 1B, the normal area NA may be located between the first optical area OA1 and the second optical area OA2. In this case, at least a part of the first optical area OA1 may overlap the first optical electronic device 11, and at least a part of the second optical area OA2 may overlap a second optical electronic device 12.

According to an example of FIG. 1C, the display area DA may include a first optical area OA1, a second optical area OA2, and a normal area NA. In the example of FIG. 1C, the normal area NA may not be located between the first optical area OA1 and the second optical area OA2. That is, the first optical area OA1 and the second optical area OA2 may contact each other. In this case, at least a part of the first optical area OA1 may overlap the first optical electronic device 11, and at least a part of the second optical area OA2 may overlap the second optical electronic device 12.

Both an image display structure and a light transmission structure are needed to be implemented in the one or more optical areas OA1, OA2. That is, since the one or more optical areas OA1, OA2 are a part of the display area DA, subpixels for displaying images are needed to be disposed in the one or more optical areas OA1, OA2. Further, for enabling light to be transmitted to the one or more optical electronic devices 11, 12, a light transmission structure is needed to be implemented in the one or more optical areas OA1, OA2.

According to the aspects described above, in spite of a fact that the one or more optical electronic devices 11, 12 are needed to receive or detect light, the one or more optical electronic devices 11, 12 becomes located on the back of the display panel 110 (under, or a lower portion of, the display panel 110, i.e., the opposite side to the viewing surface).

That is, the one or more optical electronic devices 11, 12 are not exposed in the front surface (viewing surface) of the display panel 110. Accordingly, when a user looks at the front of the display device 110, the optical electronic devices 11, 12 are located not to be visible to the user.

In an aspect, the first optical electronic device 11 may be a camera, and the second optical electronic device 12 may be a sensor such as a proximity sensor, an illuminance sensor, and/or the like. For example, the sensor may be an infrared sensor capable of detecting infrared rays.

In another aspect, the first optical electronic device 11 may be the sensor, and the second optical electronic device 12 may be the camera.

Hereinafter, for convenience of description, discussions will be conducted on the aspect in which the first optical electronic device 11 is the camera, and the second optical electronic device 12 is the sensor such as a proximity sensor, an illuminance sensor, an infrared sensor, and the like. Here, the camera may be a camera lens, an image sensor, or a unit including at least one of the camera lens and the image sensor.

In a case where the first optical electronic device 11 is the camera, this camera may be located on the back of (under, or a lower portion of) the display panel 110, and be a front camera capable of capturing objects in a front direction of the display panel 110. Accordingly, the user can capture an image through the camera that is not visible on the viewing surface while looking at the viewing surface of the display panel 110.

Although the normal area NA and the one or more optical areas OA1, OA2 included in the display area DA in each of FIGS. 1A to 1C are areas where images can be displayed, the normal area NA is an area where a light transmission structure need not be implemented, however, the one or more optical areas OA1, OA2 are areas in which the light transmission structure need be implemented.

Accordingly, the one or more optical areas OA1, OA2 may have a transmittance greater than or equal to a predetermined level, i.e., a relatively high transmittance, and the normal area NA may not have light transmittance or have a transmittance less than the predetermined level i.e., a relatively low transmittance.

For example, the one or more optical areas OA1, OA2 may have a resolution, a subpixel arrangement structure, the number of subpixels per unit area, an electrode structure, a line structure, an electrode arrangement structure, a line arrangement structure, or/and the like different from that/those of the normal area NA.

In an aspect, the number of subpixels per unit area in the one or more optical areas OA1, may be smaller than the number of subpixels per unit area in the normal area NA. That is, the resolution of the one or more optical areas OA1, OA2 may be lower than that of the normal area NA. Here, the number of subpixels per unit area may have the same meaning as resolution, pixel density, or a degree of integration of pixels. For example, the unit of the number of subpixels per unit area may be Pixels Per Inch (PPI), which represents the number of pixels within 1 inch.

In an aspect, the number of subpixels per unit area in the first optical areas OA1 may be smaller than the number of subpixels per unit area in the normal area NA. In an aspect, the number of subpixels per unit area in the second optical areas OA2 may be greater than or equal to the number of subpixels per unit area in the first optical areas OA1, and be smaller than the number of subpixels per unit area in the normal area NA.

The first optical area OA1 may have various shapes, such as a circle, an ellipse, a quadrangle, a hexagon, an octagon or the like. The second optical area OA2 may have various shapes, such as a circle, an ellipse, a quadrangle, a hexagon, an octagon or the like. The first optical area OA1 and the second optical area OA2 may have the same shape or different shapes.

Referring to FIG. 1C, in a case where the first optical area OA1 and the second optical area OA2 contact each other, the entire optical area including the first optical area OA1 and the second optical area OA2 may also have various shapes, such as a circle, an ellipse, a quadrangle, a hexagon, an octagon or the like.

Hereinafter, for convenience of description, discussions will be conducted based on an aspect in which each of the first optical area OA1 and the second optical area OA2 has a circular shape.

When the display device 100 according to aspects of the present disclosure has a structure in which the first optical electronic device 11 such as a camera, etc. is located under, or a lower portion of, the display panel 100 without being exposed to the outside, such a display device 100 according to aspects of the present disclosure may be referred to as a display to which under-display camera (UDC) technology is applied.

According to this configuration, in the case of the display device 100 according to aspects of the present disclosure, since a notch or a camera hole for exposing a camera need not be formed in the display panel 110, it is possible to prevent the area of the display area DA from being reduced.

In other words, since the notch or the camera hole for camera exposure need not be formed in the display panel 110, the size of the bezel area can be reduced, and a substantial disadvantage in design can be removed or reduced, thereby increasing the degree of freedom in design.

Although the one or more optical electronic devices 11, 12 are located on the back of (under, or a lower portion of) the display panel 110 in the display device 100 according to aspects of the present disclosure, that is, hidden not to be exposed to the outside, the one or more optical electronic devices 11, 12 are needed to normally perform predefined functionality, and thus, to be able to receive or detect light.

Further, in the display device 100 according to aspects of the present disclosure, although one or more optical electronic devices 11, 12 are located on the back of (under, or a lower portion of) the display panel 110 to be hidden and located to be overlapped with the display area DA, it is necessary for image display to be normally performed in the one or more optical areas OA1, OA2 overlapping the one or more optical electronic devices 11, 12 in the display area DA.

Figure 2:
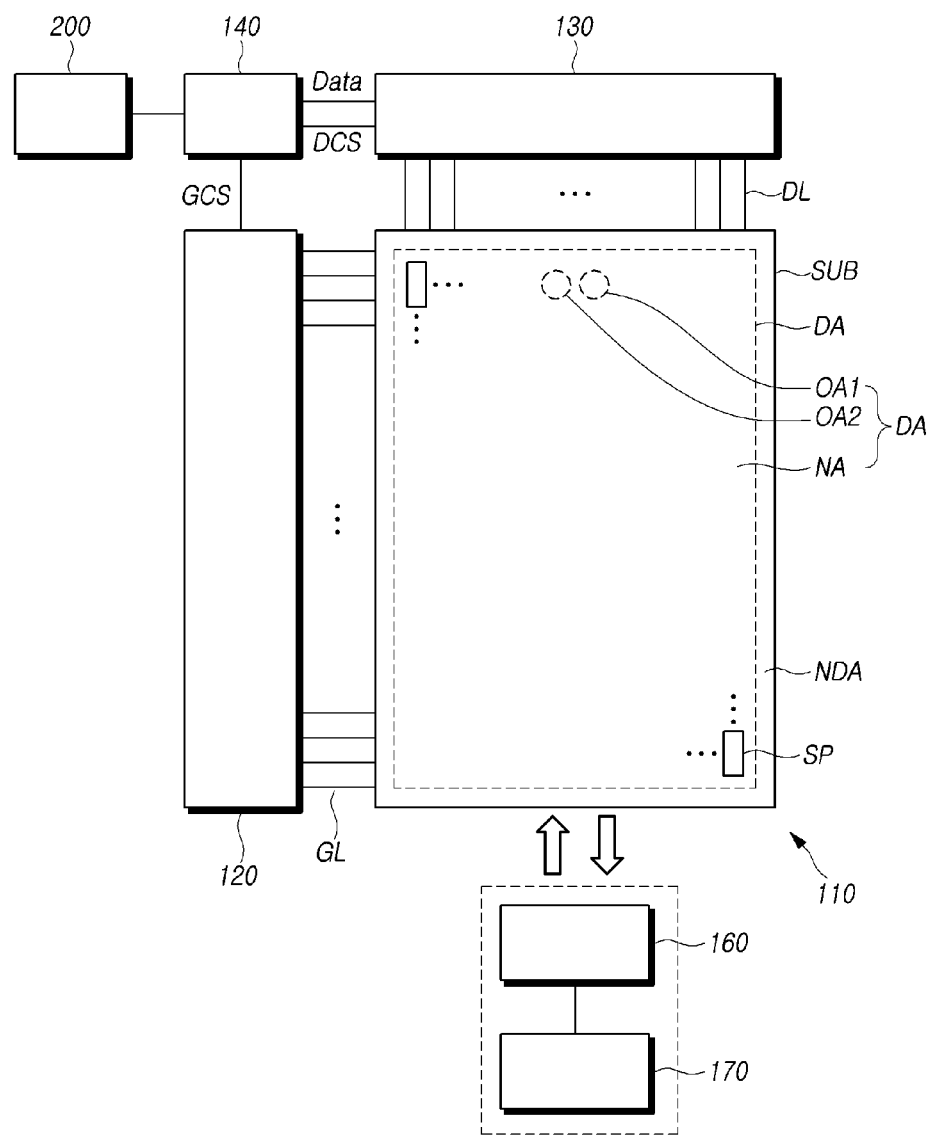
FIG. 2 illustrates a system configuration of the display device according to aspects of the present disclosure.

FIG. 2 illustrates a system configuration of the display device 100 according to aspects of the present disclosure.

Referring to FIG. 2, the display device 100 may include the display panel 110 and a display driving circuit as components for displaying an image.

The display driving circuit is a circuit for driving the display panel 110, and may include a data driving circuit 130, a gate driving circuit 120, a display controller 140, and the like.

The display panel 110 can include the display area DA in which an image is displayed and the non-display area NDA in which an image is not displayed. The non-display area NDA may be an area outside of the display area DA, and may also be referred to as a bezel area. All or a part of the non-display area NDA may be an area visible from the front surface of the display device 100, or an area that is bent and not visible from the front surface of the display device 100.

The display panel 110 may include a substrate SUB and a plurality of subpixels SP disposed on the substrate SUB. The display panel 110 may further include various types of signal lines to drive the plurality of subpixels SP.

The display device 100 according to aspects of the present disclosure may be a liquid crystal display device, or the like, or a self-emissive display device in which light is emitted from the display panel 110 itself. When the display device 100 according to aspects of the present disclosure is the self-emissive display device, each of the plurality of subpixels SP may include a light emitting element.

In one aspect, the display device 100 according to aspects of the present disclosure may be an organic light emitting display device in which the light emitting element is implemented using an organic light emitting diode (OLED). For another aspect, the display device 100 according to aspects of the present disclosure may be an inorganic light emitting display device in which the light emitting element is implemented using an inorganic material-based light emitting diode. In further another aspect, the display device 100 according to aspects of the present disclosure may be a quantum dot display device in which the light emitting element is implemented using quantum dots, which are self-emissive semiconductor crystals.

The structure of each of the plurality of subpixels SP may vary according to types of the display devices 100. For example, when the display device 100 is a self-emissive display device including self-emissive subpixels SP, each subpixel SP may include a self-emissive light emitting element, one or more transistors, and one or more capacitors.

For example, various types of signal lines may include a plurality of data lines DL for carrying data signals (also referred to as data voltages or image signals), a plurality of gate lines GL for carrying gate signals (also referred to as scan signals), and the like.

The plurality of data lines DL and the plurality of gate lines GL may intersect each other. Each of the plurality of data lines DL may be disposed to extend in a first direction. Each of the plurality of gate lines GL may be disposed to extend in a second direction.

Here, the first direction may be a column direction, and the second direction may be a row direction. Alternatively, the first direction may be the row direction, and the second direction may be the column direction.

The data driving circuit 130 is a circuit for driving the plurality of data lines DL, and can supply data signals to the plurality of data lines DL. The gate driving circuit 120 is a circuit for driving the plurality of gate lines GL, and can supply gate signals to the plurality of gate lines GL.

The display controller 140 is a device for controlling the data driving circuit 130 and the gate driving circuit 120, and may control driving timing for the plurality of data lines DL and driving timing for the plurality of gate lines GL.

The display controller 140 can supply a data driving control signal DCS to the data driving circuit 130 to control the data driving circuit 130, and supply a gate driving control signal GCS to the gate driving circuit 120 to control the gate driving circuit 120.

The display controller 140 can receive input image data from a host system 200 and supply image data Data to the data driving circuit 220 based on the input image data.

The data driving circuit 130 may supply data signals to a plurality of data lines DL according to driving timing control of the display controller 140.

The data driving circuit 130 can receive the digital image data Data from the display controller 140, convert the received image data Data into analog data signals, and supply the resulting analog data signals to the plurality of data lines DL.

The gate driving circuit 120 may supply gate signals to a plurality of gate lines GL according to timing control of the display controller 140. The gate driving circuit 120 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In some aspects, the data driving circuit 130 may be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

The gate driving circuit 120 may be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type.

The gate driving circuit 120 may be disposed in the non-display area NDA of the display panel 110 in a gate in panel (GIP) type. The gate driving circuit 120 may be disposed on or over the substrate, or connected to the substrate. That is, in the case of the GIP type, the gate driving circuit 120 may be disposed in the non-display area NDA of the substrate. The gate driving circuit 120 may be connected to the substrate in the case of the chip on glass (COG) type, the chip on film (COF) type, or the like.

At least one of the data driving circuit 130 and the gate driving circuit 120 may be disposed in the display area DA of the display panel 110. For example, at least one of the data driving circuit 130 and the gate driving circuit 120 may be disposed not to overlap subpixels SP, or disposed to overlap one or more, or all, of the subpixels SP.

The data driving circuit 130 may also be located in, but not limited to, one portion (e.g., an upper portion or a lower portion) of the display panel 110. In some aspects, the data driving circuit 130 may be located in, but not limited to, two portions (e.g., an upper portion and a lower portion) of the display panel 110 or at least two of four portions (e.g., the upper portion, the lower portion, a left portion, and a right portion) of the display panel 110 according to driving schemes, panel design schemes, or the like.

The gate driving circuit 120 may also be located in, but not limited to, one portion (e.g., a left portion or a right portion) of the display panel 110. In some aspects, the gate driving circuit 120 may be located in, but not limited to, two portions (e.g., a left portion and a right portion) of the display panel 110 or at least two of four portions (e.g., an upper portion, a lower portion, the left portion, and the right portion) of the display panel 110 according to driving schemes, panel design schemes, or the like.

The display controller 140 may be implemented in a separate component from the data driving circuit 130, or integrated with the data driving circuit 130 and thus implemented in an integrated circuit.

The display controller 140 may be a timing controller used in the typical display technology or a controller or a control device capable of additionally performing other control functions in addition to the function of the typical timing controller. In some aspects, the display controller 140 may be a controller or a control device different from the timing controller, or a circuitry or a component included in the controller or the control device. The display controller 140 may be implemented with various circuits or electronic components such as an integrated circuit (IC), a field programmable gate array (FPGA), an application specific integrated circuit (ASIC), a processor, and/or the like.

The display controller 140 may be mounted on a printed circuit board, a flexible printed circuit, and/or the like and be electrically connected to the gate driving circuit 130 and the data driving circuit 120 through the printed circuit board, flexible printed circuit, and/or the like.

The display controller 140 may transmit signals to, and receive signals from, the data driving circuit 220 via one or more predetermined interfaces. In some aspects, such interfaces may include a low voltage differential signaling (LVDS) interface, an EPI(embedded point-to-point interface), a SPI(serial peripheral interface), and the like.

In order to further provide a touch sensing function, as well as an image display function, the display device 100 according to aspects of the present disclosure may include at least one touch sensor, and a touch circuit capable of detecting whether a touch event occurs by a touch object such as a finger, a pen, or the like, or of detecting a corresponding touch position, by sensing the touch sensor.

The touch circuit may include a touch driving circuit 160 capable of generating and providing touch sensing data by driving and sensing the touch sensor, a touch controller 170 capable of detecting the occurrence of a touch event or detecting a touch position using the touch sensing data, and the like.

The touch sensor may include a plurality of touch electrodes. The touch sensor may further include a plurality of touch lines for electrically connecting the plurality of touch electrodes to the touch driving circuit 160.

The touch sensor may be disposed in a touch panel, or in the form of a touch panel, outside of the display panel 110, or be disposed inside of the display panel 110. When the touch sensor is disposed in the touch panel, or in the form of the touch panel, outside of the display panel 110, such a touch sensor is referred to as an add-on type. When the add-on type of touch sensor is disposed, the touch panel and the display panel 110 may be separately manufactured and combined during an assembly process. The add-on type of touch panel may include a touch panel substrate and a plurality of touch electrodes on the touch panel substrate.

When the touch sensor is disposed inside of the display panel 110, the touch sensor may be disposed over the substrate SUB together with signal lines and electrodes related to display driving during the process of manufacturing the display panel 110.

The touch driving circuit 160 can supply a touch driving signal to at least one of the plurality of touch electrodes, and sense at least one of the plurality of touch electrodes to generate touch sensing data.

The touch circuit can perform touch sensing using a self-capacitance sensing method or a mutual-capacitance sensing method.

When the touch circuit performs touch sensing in the self-capacitance sensing method, the touch sensing circuit can perform touch sensing based on capacitance between each touch electrode and a touch object (e.g., a finger, a pen, etc.).

According to the self-capacitance sensing method, each of the plurality of touch electrodes can serve as both a driving touch electrode and a sensing touch electrode. The touch driving circuit 160 can drive all or a part of the plurality of touch electrodes and sense all or a part of the plurality of touch electrodes.

When the touch circuit performs touch sensing in the mutual-capacitance sensing method, the touch circuit can perform touch sensing based on capacitance between touch electrodes.

According to the mutual-capacitance sensing method, the plurality of touch electrodes are divided into driving touch electrodes and sensing touch electrodes. The touch driving circuit 160 can drive the driving touch electrodes and sense the sensing touch electrodes.

The touch driving circuit 160 and the touch controller 170 included in the touch circuit may be implemented in separate devices or in a single device. Further, the touch driving circuit 160 and the data driving circuit 130 may be implemented in separate devices or in a single device.

The display device 100 may further include a power supply circuit for supplying various types of power to the display driving circuit and/or the touch circuit.

The display device 100 according to aspects of the present disclosure may be a mobile terminal such as a smart phone, a tablet, or the like, or a monitor, a television (TV), or the like. Such devices may be of various types, sizes, and shapes. The display device 100 according to aspects of the present disclosure are not limited thereto, and includes displays of various types, sizes, and shapes for displaying information or images.

As described above, the display area DA of the display panel 110 may include a normal area NA and one or more optical areas OA1, OA2.

The normal area NA and the one or more optical areas OA1, OA2 are areas where an image can be displayed. However, the normal area NA is an area in which a light transmission structure need not be implemented, and the one or more optical areas OA1, OA2 are areas in which the light transmission structures need to be implemented.

As discussed above with respect to the examples of FIGS. 1A to 1C, although the display area DA of the display panel 110 may include the one or more optical areas OA1, OA2 in addition to the normal area NA, for convenience of description, in the discussion that follows, it is assumed that the display area DA includes first and second optical areas OA1, OA2 and a normal area NA.

Figure 3:
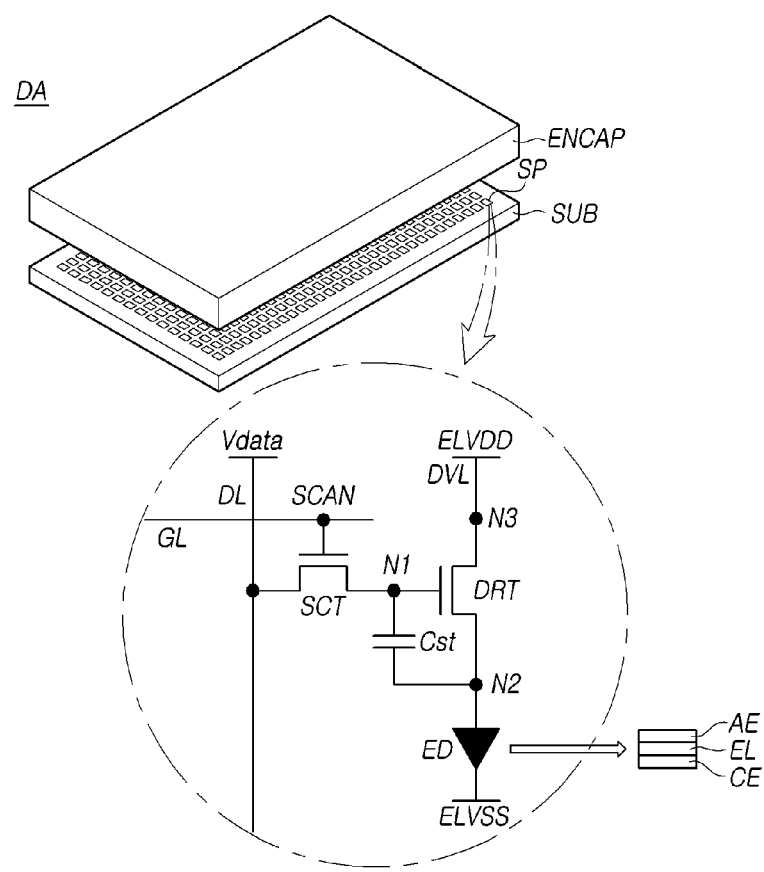
FIG. 3 illustrates an equivalent circuit of a subpixel in a display panel according to aspects of the present disclosure.

FIG. 3 illustrates an equivalent circuit of a subpixel SP in the display panel 110 according to aspects of the present disclosure.

Referring to FIG. 3, in the display panel 110 according to aspects of the present disclosure, each of subpixels SP disposed in the normal area NA, the first optical area OA1, and the second optical area OA2 included in the display area DA may include a light emitting element ED, a driving transistor DRT for driving the light emitting element ED, a scan transistor SCT for transmitting a data voltage Vdata to a first node N1 of the driving transistor DRT, a storage capacitor Cst for maintaining a voltage at an approximate constant level during one frame, and the like.

The driving transistor DRT may include the first node N1 to which a data voltage Vdata is applied, a second node N2 electrically connected to the light emitting element ED, and a third node N3 to which a driving voltage ELVDD through a driving voltage line DVL is applied. In the driving transistor DRT, the first node N1 may be a gate node, the second node N2 may be a source node or a drain node, and the third node N3 may be the drain node or the source node.

The light emitting element ED may include an anode electrode AE, an emissive layer EL, and a cathode electrode CE. The anode electrode AE may be a pixel electrode disposed in each subpixel SP, and may be electrically connected to the second node N2 of the driving transistor DRT of each subpixel SP. The cathode electrode CE may be a common electrode commonly disposed in the plurality of subpixels SP, and a base voltage ELVSS such as a low-level voltage may be applied to the cathode electrode CE.

For example, the anode electrode AE may be the pixel electrode, and the cathode electrode CE may be the common electrode. In another example, the anode electrode AE may be the common electrode, and the cathode electrode CE may be the pixel electrode. For convenience of description, in the discussion that follows, it is assumed that the anode electrode AE is the pixel electrode, and the cathode electrode CE is the common electrode unless explicitly stated otherwise.

The light emitting element ED may be, for example, an organic light emitting diode (OLED), an inorganic light emitting diode, a quantum dot light emitting element, or the like. When the organic light emitting diode is used as the light emitting element ED, the emissive layer EL thereof may include an organic emissive layer including an organic material.

The scan transistor SCT may be turned on and off by a scan signal SCAN that is a gate signal applied through a gate line GL, and be electrically connected between the first node N1 of the driving transistor DRT and a data line DL.

The storage capacitor Cst may be electrically connected between the first node N1 and the second node N2 of the driving transistor DRT.

Each subpixel SP may include two transistors (2T: DRT and SCT) and one capacitor (1C: Cst) (referred to as "2T1C structure") as shown in FIG. 3, and in some cases, may further include one or more transistors, or further include one or more capacitors.

The storage capacitor Cst may be an external capacitor intentionally designed to be located outside of the driving transistor DRT, other than an internal capacitor, such as a parasitic capacitor (e.g., a Cgs, a Cgd), that may be present between the first node N1 and the second node N2 of the driving transistor DRT.

Each of the driving transistor DRT and the scan transistor SCT may be an n-type transistor or a p-type transistor.

Since circuit elements (in particular, a light emitting element ED) in each subpixel SP are vulnerable to external moisture or oxygen, an encapsulation layer ENCAP may be disposed in the display panel 110 in order to prevent the external moisture or oxygen from penetrating into the circuit elements (in particular, the light emitting element ED). The encapsulation layer ENCAP may be disposed to cover the light emitting element ED.

FIG. 4 illustrates arrangements of subpixels SP in the three areas NA, OA1, OA2 included in the display area DA of the display panel 110 according to aspects of the present disclosure.

Referring to FIG. 4, a plurality of subpixels SP may be disposed in each of the normal area NA, the first optical area OA1, and the second optical area OA2 included in the display area DA.

The plurality of subpixels SP may include, for example, a red subpixel (Red SP) emitting red light, a green subpixel (Green SP) emitting green light, and a blue subpixel (Blue SP) emitting blue light.

Accordingly, each of the normal area NA, the first optical area OA1, and the second optical area OA2 may include one or more light emitting areas EA of one or more red subpixels (Red SP), and one or more light emitting areas EA of one or more green subpixels (Green SP), and one or more light emitting areas EA of one or more blue subpixels (Blue SP).

The normal area NA may not include a light transmission structure, but may include light emitting areas EA.

However, the first optical area OA1 and the second optical area OA2 need to include both the light emitting areas EA and the light transmission structure.

Accordingly, the first optical area OA1 can include light emitting areas EA and first transmission areas TA1, and the second optical area OA2 can include the light emitting areas EA and second transmission area TA2.

The light emitting areas EA and the transmission areas TA1, TA2 may be distinct according to whether the transmission of light is allowed. That is, the light emitting areas EA may be areas not allowing light to transmit, and the transmission areas TA1, TA2 may be area allowing light to transmit.

The light emitting areas EA and the transmission areas TA1, TA2 may be also distinct according to whether or not a specific metal layer CE is included. For example, the cathode electrode CE may be disposed in the light emitting areas EA, and the cathode electrode CE may not be disposed in the transmission areas TA1, TA2. Further, a light shield layer may be disposed in the light emitting areas EA, and the light shield layer may not be disposed in the transmission areas TA1, TA2.

Since the first optical area OA1 includes the first transmission areas TA1 and the second optical area OA2 includes the second transmission areas TA2, both of the first optical area OA1 and the second optical area OA2 are areas through which light can pass.

In one aspect, a transmittance (a degree of transmission) of the first optical area OA1 and a transmittance (a degree of transmission) of the second optical area OA2 may be substantially equal.

In this case, in one example, the first transmission area TA1 of the first optical area OA1 and the second transmission area TA2 of the second optical area OA2 may have a substantially equal shape or size. In another example, even when the first transmission area TA1 of the first optical area OA1 and the second transmission area TA2 of the second optical area OA2 have different shapes or sizes, a ratio of the first transmission area TA1 in the first optical area OA1 and a ratio of the second transmission area TA2 in the second optical area OA2 may be substantially equal.

In another aspect, a transmittance (a degree of transmission) of the first optical area OA1 and a transmittance (a degree of transmission) of the second optical area OA2 may be different.

In this case, in one example, the first transmission area TA1 of the first optical area OA1 and the second transmission area TA2 of the second optical area OA2 may have different shapes or sizes. In another example, even when the first transmission area TA1 of the first optical area OA1 and the second transmission area TA2 of the second optical area OA2 have a substantially equal shape or size, a ratio of the first transmission area TA1 in the first optical area OA1 and a ratio of the second transmission area TA2 in the second optical area OA2 may be different from each other.

For example, in a case where the first optical electronic device 11 overlapping the first optical area OA1 is a camera, and the second optical electronic device 12 overlapping the second optical area OA2 is a sensor for detecting images, the camera may need a greater amount of light than the sensor.

Thus, in this case, the transmittance (degree of transmission) of the first optical area OA1 may be greater than the transmittance (degree of transmission) of the second optical area OA2.

Further, in this case, the first transmission area TA1 of the first optical area OA1 may have a size greater than the second transmission area TA2 of the second optical area OA2. In another example, even when the first transmission area TA1 of the first optical area OA1 and the second transmission area TA2 of the second optical area OA2 have a substantially equal size, a ratio of the first transmission area TA1 in the first optical area OA1 may be greater than a ratio of the second transmission area TA2 in the second optical area OA2.

For convenience of description, the discussion that follows is performed based on the aspect in which the transmittance (degree of transmission) of the first optical area OA1 is greater than the transmittance (degree of transmission) of the second optical area OA2.

Further, the transmission areas TA1, TA2 as shown in FIG. 4 may be referred to as transparent areas, and the term transmittance may be referred to as transparency.

Further, in the discussion that follows, it is assumed that the first optical area OA1 and the second optical area OA2 are located in an upper edge of the display area DA of the display panel 110, and are disposed to be horizontally adjacent to each other such as being disposed in a direction in which the upper edge extends, as shown in FIG. 4, unless explicitly stated otherwise.

Referring to FIG. 4, a horizontal display area in which the first optical area OA1 and the second optical area OA2 are disposed is referred to as a first horizontal display area HA1, and another horizontal display area in which the first optical area OA1 and the second optical area OA2 are not disposed is referred to as a second horizontal display area HA2.

Referring to FIG. 4, the first horizontal display area HA1 may include the normal area NA, the first optical area OA1, and the second optical area OA2. The second horizontal display area HA2 may include only the normal area NA.

FIG. 5A illustrates arrangements of signal lines in each of the first optical area OA1 and the normal area NA of the display panel 110 according to aspects of the present disclosure, and FIG. 5B illustrates arrangements of signal lines in each of the second optical area OA2 and the normal area NA of the display panel 110 according to aspects of the present disclosure.

Referring to FIGS. 5A and 5B, in the display panel 110 of the present disclosure, first horizontal display areas HA1 shown in FIGS. 5A and 5B correspond to parts of a first horizontal display area HA1 of the display panel 110, and second horizontal display areas HA2 therein correspond to parts of a second horizontal display area HA2 of the display panel 110.

The first optical area OA1 of FIG. 5A corresponds to a part of the first optical area OA1 of the display panel 110, and the second optical area OA2 of FIG. 5B corresponds to a part of the second optical area OA2 of the display panel 110.

Referring to FIGS. 5A and 5B, the first horizontal display area HA1 may include the normal area NA, the first optical area OA1, and the second optical area OA2. The second horizontal display area HA2 may include the normal area NA.

Various types of horizontal lines HL1, HL2 and various types of vertical lines VLn, VL1, VL2 may be disposed in the display panel 110.

In some aspects, the term "horizontal" and the term "vertical" are used to refer to two directions intersecting the display panel; however, it should be noted that the horizontal direction and the vertical direction may be changed depending on a viewing direction. The horizontal direction may refer to, for example, a direction in which one gate line GL is disposed to extend and, and the vertical direction may refer to, for example, a direction in which one data line DL is disposed to extend. As such, the term horizontal and the term vertical are used to represent two directions.

Referring to FIGS. 5A and 5B, the horizontal lines disposed in the display panel 110 may include first horizontal lines HL1 disposed in the first horizontal display area HA1 and second horizontal lines HL2 disposed on the second horizontal display area HA2.

The horizontal lines disposed in the display panel 110 may be gate lines GL. That is, the first horizontal lines HL1 and the second horizontal lines HL2 may be the gate lines GL. The gate lines GL may include various types of gate lines according to structures of one or more subpixels SP.

Referring to FIGS. 5A and 5B, the vertical lines disposed in the display panel 110 may include typical vertical lines VLn disposed only in the normal area NA, first vertical lines VL1 running through both of the first optical area OA1 and the normal area NA, second vertical lines VL2 running through both of the second optical area OA2 and the normal area NA.

The vertical lines disposed in the display panel 110 may include data lines DL, driving voltage lines DVL, and the like, and may further include reference voltage lines, initialization voltage lines, and the like. That is, the typical vertical lines VLn, the first vertical lines VL1 and the second vertical lines VL2 may include the data lines DL, the driving voltage lines DVL, and the like, and may further include the reference voltage lines, the initialization voltage lines, and the like.

In some aspects, it should be noted that the term "horizontal" in the second horizontal line HL2 may mean only that a signal is carried from a left side to a right side (or from the right side to the left side), and may not mean that the second horizontal line HL2 runs in a straight line only in the direct horizontal direction. For example, in FIGS. 5A and 5B, although the second horizontal lines HL2 are illustrated in a straight line, however, one or more of the second horizontal lines HL2 may include one or more bent or folded portions differently from the configurations thereof. Likewise, one or more of the first horizontal lines HL1 may also include one or more bent or folded portions.

In some aspects, it should be noted that the term "vertical" in the typical vertical line VLn may mean only that a signal is carried from an upper portion to a lower portion (or from the lower portion to the upper portion), and may not mean that the typical vertical line VLn runs in a straight line only in the direct vertical direction. For example, in FIGS. 5A and 5B, although the typical vertical lines VLn are illustrated in a straight line, however, one or more of the typical vertical lines VLn may include one or more bent or folded portions differently from the configurations thereof. Likewise, one or more of the first vertical line VL1 and one or more of the second vertical line VL2 may also include one or more bent or folded portions.

Referring to FIG. 5A, the first optical area OA1 included in the first horizontal area HA1 may include light emitting areas EA and first transmission areas TA1. In the first optical area OA1, respective outer areas of the first transmission areas TA1 may include corresponding light emitting areas EA.

Referring to FIG. 5A, in order to improve the transmittance of the first optical area OA1, the first horizontal lines HL1 may run through the first optical area OA1 by avoiding the first transmission areas TA1 in the first optical area OA1.

Accordingly, each of the first horizontal lines HL1 running through the first optical area OA1 may include one or more curved or bent portions running around one or more respective outer edges of one or more of the first transmission areas TA1.

Accordingly, the first horizontal lines HL1 disposed in the first horizontal area HA1 and the second horizontal lines HL2 disposed in the second horizontal area HA2 may have different shapes or lengths. That is, the first horizontal lines HL1 running through the first optical area OA1 and the second horizontal lines HL2 not running through the first optical area OA1 may have different shapes or lengths.

Further, in order to improve the transmittance of the first optical area OA1, the first vertical lines VL1 may run through the first optical area OA1 by avoiding the first transmission areas TA1 in the first optical area OA1.

Accordingly, each of the first vertical lines VL1 running through the first optical area OA1 may include one or more curved or bent portions running around one or more respective outer edges of one or more of the first transmission areas TA1.

Thus, the first vertical lines VL1 running through the first optical area OA1 and the typical vertical lines VLn disposed in the normal area NA without running through the first optical area OA1 may have different shapes or lengths.

Referring to FIG. 5A, the first transmission areas TA1 included in the first optical area OA1 in the first horizontal area HA1 may be arranged in a diagonal direction.

Referring to FIG. 5A, in the first optical area OA1 in the first horizontal area HAL one or more light emitting areas EA may be disposed between two horizontally adjacent first transmission areas TA1. In the first optical area OA1 in the first horizontal area HAL one or more light emitting areas EA may be disposed between two vertically adjacent first transmission areas TA1.

Referring to FIG. 5A, the first horizontal lines HL1 disposed in the first horizontal area HAL that is, the first horizontal lines HL1 running through the first optical area OA1 each may include one or more curved or bent portions running around one or more respective outer edges of one or more of the first transmission areas TA1.

Referring to FIG. 5B, the second optical area OA2 included in the first horizontal area HA1 may include light emitting areas EA and second transmission areas TA2. In the second optical area OA2, respective outer areas of the second transmission areas TA2 may include corresponding light emitting areas EA.

In one aspect, the light emitting areas EA and the second transmission areas TA2 in the second optical area OA2 may have locations and arrangements substantially equal to the light emitting areas EA and the first transmission areas TA1 in the first optical area OA1 of FIG. 5A.

In another aspect, as shown in FIG. 5B, the light emitting areas EA and the second transmission areas TA2 in the second optical area OA2 may have locations and arrangements different from the light emitting areas EA and the first transmission areas TA1 in the first optical area OA1 of FIG. 5A.

For example, referring to FIG. 5B, the second transmission areas TA2 in the second optical area OA2 may be arranged in the horizontal direction (the left to right (or right to left) direction). A light emitting area EA may not be disposed between two second transmission areas TA2 adjacent to each other in the horizontal direction. Further, one or more of the light emitting areas EA in the second optical area OA2 may be disposed between second transmission areas TA2 adjacent to each other in the vertical direction (the top to bottom (or bottom to top) direction). That is, one or more light emitting areas EA may be disposed between two rows of second transmission areas.

When running through the second optical area OA2 in the first horizontal area HA1 and the normal area NA adjacent to the second optical area OA2, in one aspect, the first horizontal lines HL1 may have substantially the same arrangement as FIG. 5A.

In another aspect, as shown in FIG. 5B, when running through the second optical area in the first horizontal area HA1 and the normal area NA adjacent to the second optical area the first horizontal lines HL1 may have an arrangement different from FIG. 5A.

This is because that the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

Referring to FIG. 5B, when the first horizontal lines HL1 run through the second optical area OA2 in the first horizontal area HA1 and the normal area NA adjacent to the second optical area OA2, the first horizontal lines HL1 may run between vertically adjacent second transmission areas TA2 in a straight line without having a curved or bent portion.

In other words, one first horizontal line HL1 may have one or more curved or bent portions in the first optical area OA1, but may not have a curved or bent portion in the second optical area OA2.

In order to improve the transmittance of the second optical area OA2, the second vertical lines VL2 may run through the second optical area OA2 by avoiding the second transmission areas TA2 in the second optical area OA2.

Accordingly, each of the second vertical lines VL2 running through the second optical area OA2 may include one or more curved or bent portions running around one or more respective outer edges of one or more of the second transmission areas TA2.

Thus, the second vertical lines VL2 running through the second optical area OA2 and the typical vertical lines VLn disposed in the normal area NA without running through the second optical area OA2 may have different shapes or lengths.

As shown in FIG. 5A, each, or one or more, of the first horizontal lines HL1 running through the first optical area OA1 may have one or more curved or bent portions running around one or more respective outer edges of one or more of the first transmission areas TA1.

Accordingly, a length of the first horizontal line HL1 running through the first optical area OA1 and the second optical area OA2 may be slightly longer than a length of the second horizontal line HL2 disposed only in the normal area NA without running through the first optical area OA1 and the second optical area OA2.

Accordingly, a resistance of the first horizontal line HL1 running through the first optical area OA1 and the second optical area OA2, which is referred to as a first resistance, may be slightly greater than a resistance of the second horizontal line HL2 disposed only in the normal area NA without running through the first optical area OA1 and the second optical area OA2, which is referred to as a second resistance.

Referring to FIGS. 5A and 5B, according to a light transmitting structure, since the first optical area OA1 that at least partially overlaps the first optical electronic device 11 includes the first transmission areas TA1, and the second optical area OA2 that at least partially overlaps with the second optical electronic device 12 includes the second transmission areas TA2, therefore, the first optical area OA1 and the second optical area OA2 may have a smaller number of subpixels per unit area than the normal area NA.

Accordingly, the number of subpixels connected to each, or one or more, of the first horizontal lines HL1 running through the first optical area OA1 and the second optical area OA2 may be different from the number of subpixels connected to each, or one or more, of the second horizontal lines HL2 disposed only in the normal area NA without running through the first optical area OA1 and the second optical area OA2.

The number of subpixels connected to each, or one or more, of the first horizontal lines HL1 running through the first optical area OA1 and the second optical area OA2, which is referred to as a first number, may be smaller than the number of subpixels connected to each, or one or more, of the second horizontal lines HL2 disposed only in the normal area NA without running through the first optical area OA1 and the second optical area OA2, which is referred to as a second number.

A difference between the first number and the second number may vary according to a difference between a resolution of each of the first optical area OA1 and the second optical area and a resolution of the normal area NA. For example, as a difference between a resolution of each of the first optical area OA1 and the second optical area OA2 and a resolution of the normal area NA increases, a difference between the first number and the second number may increase.

As described above, since the number (the first number) of subpixels connected to each, or one or more, of the first horizontal lines HL1 running through the first optical area OA1 and the second optical area OA2 is smaller than the number of subpixels (second number) connected to each, or one or more, of the second horizontal lines HL2 disposed only in the normal area NA without running through the first optical area OA1 and the second optical area OA2, an area where the first horizontal line HL1 overlaps one or more other electrodes or lines adjacent to the first horizontal line HL1 may be smaller than an area where the second horizontal line HL2 overlaps one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, may be greatly smaller than a parasitic capacitance formed between the second horizontal line HL2 and one or more other electrodes or lines adjacent to the second horizontal line HL2, which is referred to as a second capacitance.

Considering a relationship in magnitude between the first resistance and the second resistance (the first resistance≥the second resistance) and a relationship in magnitude between the first capacitance and the second capacitance (the first capacitance<<second capacitance), a resistance-capacitance (RC) value of the first horizontal line HL1 running through the first optical area OA1 and the second optical area OA2, which is referred to as a first RC value, may be greatly smaller than an RC value of the second horizontal lines HL2 disposed only in the normal area NA without running through the first optical area OA1 and the second optical area OA2, which is referred to as a second RC value, that is, resulting in the first RC value<<the second RC value.

Due to such a difference between the first RC value of the first horizontal line HL1 and the second RC value of the second horizontal line HL2, which is referred to as RC load differentiation, a signal transmission characteristic through the first horizontal line HL1 may be different from a signal transmission characteristic through the second horizontal line HL2.

Figure 6:
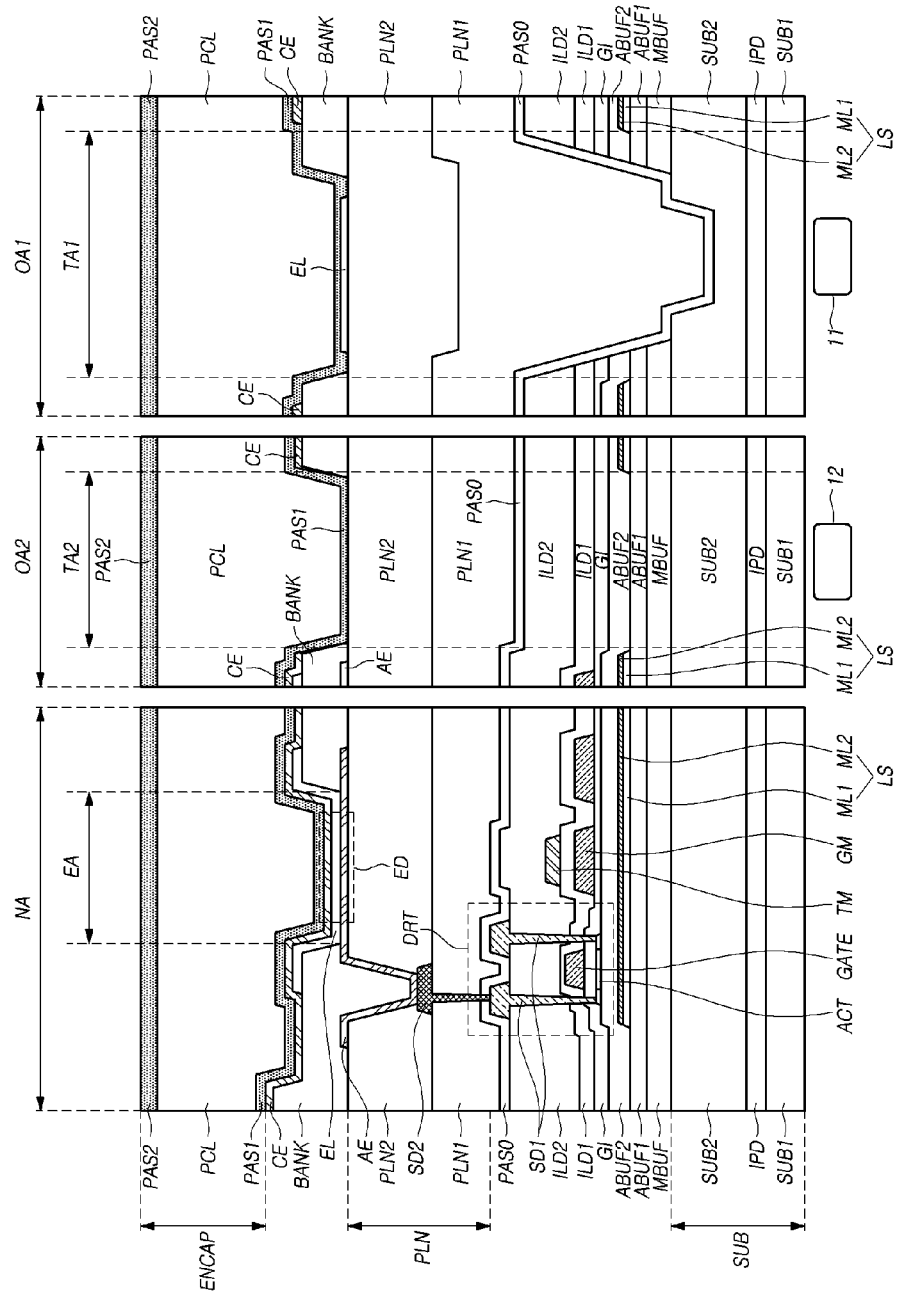
FIGS. 6 and 7 are cross-sectional views of each of the first optical area, the second optical area, and the normal area included in the display area of the display panel according to aspects of the present disclosure.
Figure 7:
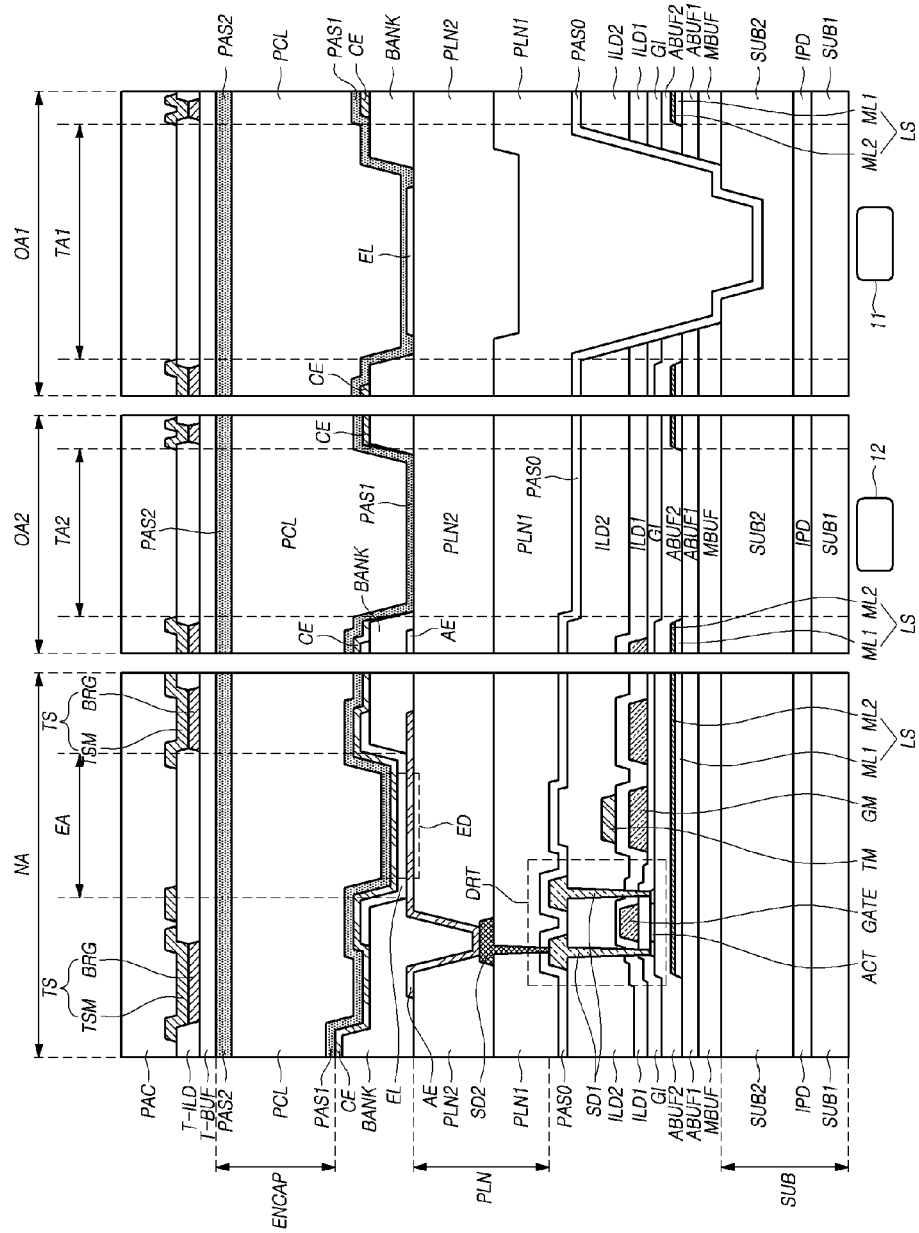

FIGS. 6 and 7 are cross-sectional views of each of the first optical area OA1, the second optical area OA2, and the normal area NA included in the display area DA of the display panel 110 according to aspects of the present disclosure.

FIG. 6 shows the display panel 110 in a case where a touch sensor is present outside of the display panel 110 in the form of a touch panel, and FIG. 7 shows the display panel 110 in a case where a touch sensor TS is present inside of the display panel 110.

Each of FIGS. 6 and 7 shows cross-sectional views of the normal area NA, the first optical area OA1, and the second optical area OA2 included in the display area DA.

Respective light emitting areas EA included in the first optical area OA1 and the second optical area OA2 may have the same stack structure as the light emitting area EA in the normal area NA.

Referring to FIGS. 6 and 7, a substrate SUB may include a first substrate SUB1, an interlayer insulating layer IPD, and a second substrate SUB2. The interlayer insulating layer IPD may be located between the first substrate SUB1 and the second substrate SUB2. As the substrate SUB includes the first substrate SUB1, the interlayer insulating layer IPD, and the second substrate SUB2, the substrate SUB can prevent the penetration of moisture. The first substrate SUB1 and the second substrate SUB2 may be, for example, polyimide (PI) substrates. The first substrate SUB1 may be referred to as a primary PI substrate, and the second substrate SUB2 may be referred to as a secondary PI substrate.

Referring to FIGS. 6 and 7, various types of patterns ACT, SD1, GATE, for disposing one or more transistors such as a driving transistor DRT, and the like, various types of insulating layers MBUF, ABUF1, ABUF2, GI, ILD1, ILD2, PAS0, and various types of metal patterns TM, GM, ML1, ML2 may be disposed on or over the substrate SUB.

Referring to FIGS. 6 and 7, a multi-buffer layer MBUF may be disposed on the second substrate SUB2, and a first active buffer layer ABUF1 may be disposed on the multi-buffer layer MBUF.

A first metal layer ML1 and a second metal layer ML2 may be disposed on the first active buffer layer ABUF1. The first metal layer ML1 and the second metal layer ML2 may be, for example, a light shield layer LS for shielding light.

A second active buffer layer ABUF2 may be disposed on the first metal layer ML1 and the second metal layer ML2. An active layer ACT of the driving transistor DRT may be disposed on the second active buffer layer ABUF2.

A gate insulating layer GI may be disposed to cover the active layer ACT.

A gate electrode GATE of the driving transistor DRT may be disposed on the gate insulating layer GI. In this situation, together with the gate electrode GATE of the driving transistor DRT, a gate material layer GM may be disposed on the gate insulating layer GI at a location different from a location where the driving transistor DRT is disposed.

The first interlayer insulating layer ILD1 may be disposed to cover the gate electrode GATE and the gate material layer GM. A metal pattern TM may be disposed on the first interlayer insulating layer ILD1. The metal pattern TM may be located at a location different from a location where the driving transistor DRT is formed. A second interlayer insulating layer ILD2 may be disposed to cover the metal pattern TM on the first interlayer insulating layer ILD1.

Two first source-drain electrode patterns SD1 may be disposed on the second interlayer insulating layer ILD2. One of the two first source-drain electrode patterns SD1 may be a source node of the driving transistor DRT, and the other may be a drain node of the driving transistor DRT.

The two first source-drain electrode patterns SD1 may be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping the gate electrode GATE may be a channel region. One of the two first source-drain electrode patterns SD1 may be connected to the first side portion of the channel region of the active layer ACT, and the other of the two first source-drain electrode patterns SD1 may be connected to the second side portion of the channel region of the active layer ACT.

A passivation layer PAS0 is disposed to cover the two first source-drain electrode patterns SD1. A planarization layer PLN may be disposed on the passivation layer PAS0. The planarization layer PLN may include a first planarization layer PLN1 and a second planarization layer PLN2.

The first planarization layer PLN1 may be disposed on the passivation layer PAS0.

A second source-drain electrode pattern SD2 may be disposed on the first planarization layer PLN1. The second source-drain electrode pattern SD2 may be connected to one of the two first source-drain electrode patterns SD1 (corresponding to the second node N2 of the driving transistor DRT in the subpixel SP of FIG. 3) through a contact hole formed in the first planarization layer PLN1.

The second planarization layer PLN2 may be disposed to cover the second source-drain electrode pattern SD2. A light emitting element ED may be disposed on the second planarization layer PLN2.

Looking at the stacked structure of the light emitting element ED, an anode electrode AE may be disposed on the second planarization layer PLN2. The anode electrode AE may be electrically connected to the second source-drain electrode pattern SD2 through a contact hole of the second planarization layer PLN2.

A bank BANK may be disposed to cover a portion of the anode electrode AE. A portion of the bank BANK corresponding to a light emitting area EA of the subpixel SP may be opened.

A portion of the anode electrode AE may be exposed through the opening (the opened portion) of the bank BANK. An emissive layer EL may be positioned on side surfaces of the bank BANK and in the opening (the opened portion) of the bank BANK. All or at least a portion of the emissive layer EL may be positioned between adjacent banks.

In the opening of the bank BANK, the emissive layer EL may contact the anode electrode AE. A cathode electrode CE may be disposed on the emissive layer EL.

The light emitting element ED can be formed by comprising the anode electrode AE, the emissive layer EL, and the cathode electrode CE, as described above. The emissive layer EL may include an organic layer.

An encapsulation layer ENCAP may be disposed on the stack of the light emitting element ED.

The encapsulation layer ENCAP may have a single-layer structure or a multi-layer structure For example, as shown in FIGS. 6 and 7, the encapsulation layer ENCAP may include a first encapsulation layer PAS1, a second encapsulation layer PCL, and a third encapsulation layer PAS2.

The first encapsulation layer PAS1 and the third encapsulation layer PAS2 may be, for example, an inorganic layer, and the second encapsulation layer PCL may be, for example, an organic layer. Among the first encapsulation layer PAS1, the second encapsulation layer PCL, and the third encapsulation layer PAS2, the second encapsulation layer PCL may be the thickest and serve as a planarization layer.

The first encapsulation layer PAS1 may be disposed on the cathode electrode CE and may be disposed closest to the light emitting element ED. The first encapsulation layer PAS1 may include an inorganic insulating material capable of being deposited using low-temperature deposition. For example, the first encapsulation layer PAS1 may include, but not limited to, silicon nitride (SiNx), silicon oxide (SiOx), silicon oxynitride (SiON), aluminum oxide (Al2O3), or the like. Since the first encapsulation layer PAS1 can be deposited in a low temperature atmosphere, during the deposition process, the first encapsulation layer PAS1 can prevent the emissive layer EL including an organic material vulnerable to a high temperature atmosphere from being damaged.

The second encapsulation layer PCL may have a smaller area than the first encapsulation layer PAS1. In this case, the second encapsulation layer PCL may be disposed to expose both ends or edges of the first encapsulation layer PAS1. The second encapsulation layer PCL can serve as a buffer for relieving stress between corresponding layers while the display device 100 is curved or bent, and also serve to enhance planarization performance. For example, the second encapsulation layer PCL may include an organic insulating material, such as acrylic resin, epoxy resin, polyimide, polyethylene, silicon oxycarbon (SiOC), or the like. The second encapsulation layer PCL may be disposed, for example, using an inkjet scheme.

The third encapsulation layer PAS2 may be disposed over the substrate SUB over which the second encapsulation layer PCL is disposed to cover the respective top surfaces and side surfaces of the second encapsulation layer PCL and the first encapsulation layer PAS1. The third encapsulation layer PAS2 can reduce or prevent external moisture or oxygen from penetrating into the first encapsulation layer PAS1 and the second encapsulation layer PCL. For example, the third encapsulation layer PAS2 may include an inorganic insulating material, such as silicon nitride (SiNx), silicon oxide (SiOx), silicon oxynitride (SiON), aluminum oxide (Al2O3), or the like.

Referring to FIG. 7, in a case where a touch sensor TS is embedded into the display panel 110, the touch sensor TS may be disposed on the encapsulation layer ENCAP. The structure of the touch sensor will be described in detail as follows.

A touch buffer layer T-BUF may be disposed on the encapsulation layer ENCAP. The touch sensor TS may be disposed on the touch buffer layer T-BUF.

The touch sensor TS may include touch sensor metals TSM and at least one bridge metal BRG, which are located in different layers.

A touch interlayer insulating layer T-ILD may be disposed between the touch sensor metals TSM and the bridge metal BRG.

For example, the touch sensor metals TSM may include a first touch sensor metal TSM, a second touch sensor metal TSM, and a third touch sensor metal TSM, which are disposed adjacent to one another. In an aspect where the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM may be electrically connected to each other through the bridge metal BRG located in a different layer. The bridge metal BRG may be insulated from the third touch sensor metal TSM by the touch interlayer insulating layer T-ILD.

While the touch sensor TS is disposed on the display panel 110, a chemical solution (developer or etchant, etc.) used in the corresponding process or moisture from the outside may be generated or introduced. By disposing the touch sensor TS on the touch buffer layer T-BUF, it is possible to prevent a chemical solution or moisture from penetrating into the emissive layer EL including an organic material during the manufacturing process of the touch sensor TS. Accordingly, the touch buffer layer T-BUF can prevent damage to the emissive layer EL, which is vulnerable to a chemical solution or moisture.

In order to prevent damage to the emissive layer EL including an organic material, which is vulnerable to high temperatures, the touch buffer layer T-BUF can be formed at a low temperature less than or equal to a predetermined temperature (e.g. 100 degrees (° C.)) and be formed using an organic insulating material having a low permittivity of 1 to 3. For example, the touch buffer layer T-BUF may include an acrylic-based, epoxy-based, or siloxan-based material. As the display device 100 is bent, the encapsulation layer ENCAP may be damaged, and the touch sensor metal located on the touch buffer layer T-BUF may be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS.

A protective layer PAC may be disposed to cover the touch sensor TS. The protective layer PAC may be, for example, an organic insulating layer.

Next, a stack structure of the first optical area OA1 will be described with reference to FIGS. 6 and 7.

Referring to FIGS. 6 and 7, a light emitting area EA in the first optical area OA1 may have the same stack structure as that in the normal area NA. Accordingly, in the discussion that follows, instead of repeatedly describing the light emitting area EA in the first optical area OA1, a stack structure of a first transmission area TA1 in the first optical area OA1 will be described in detail below.

The cathode electrode CE may be disposed in the light emitting areas EA included in the normal area NA and the first optical area OA1, but may not be disposed in the first transmission area TA1 in the first optical area OA1. That is, the first transmission area TA1 in the first optical area OA1 may correspond to an opening of the cathode electrode CE.

Further, the light shield layer LS including at least one of the first metal layer ML1 and the second metal layer ML2 may be disposed in the light emitting areas EA included in the normal area NA and the first optical area OA1, but may not be disposed in the first transmission area TA1 in the first optical area OA1. That is, the first transmission area TA1 in the first optical area OA1 may correspond to an opening of the light shield layer LS.

The substrate SUB1, SUB2, and the various types of insulating layers MBUF, ABUF1, ABUF2, GI, ILD1, ILD2, PAS0, PLN (PLN1, PLN2), BANK, ENCAP (PAS1, PCL, PAS2), T-BUF, T-ILD, PAC disposed in the light emitting areas EA included in the normal area NA and the first optical area OA1 may be disposed in the first transmission area TA1 in the first optical area OA1, equally, substantially equally, or similarly.

However, all or at least a part of one or more material layers having electrical properties (e.g., a metal material layer, a semiconductor layer, etc.), except for the insulating materials or layers, disposed in the light emitting areas EA included in the normal area NA and the first optical area OA1 may not be disposed in the first transmission area TA1 in the first optical area OA1.

For example, referring to FIGS. 6 and 7, all or at least a part of the metal material layers ML1, ML2, GATE, GM, TM, SD1, SD2 related to at least one transistor and the semiconductor layer ACT may not be disposed in the first transmission area TA1.

Further, referring to FIGS. 6 and 7, the anode electrode AE and the cathode electrode CE included in the light emitting element ED may not be disposed in the first transmission area TA1. In this case, it should be noted that the emissive layer EL of the light emitting element ED may or may not be disposed in the first transmission area TA1 according to a design requirement.

Further, referring to FIG. 7, the touch sensor metal TSM and the bridge metal BRG included in the touch sensor TS may not be disposed in the first transmission area TA1 in the first optical area OA1.

Accordingly, the light transmittance of the first transmission area TA1 in the first optical area OA1 can be provided or improved because the material layers (e.g., the metal material layer, the semiconductor layer, etc.) having electrical properties are not disposed in the first transmission area TA1 in the first optical area OA1. As a consequence, the first optical electronic device 11 can receive light transmitting through the first transmission area TA1 and perform a corresponding function (e.g., image sensing).

Since all or a portion of the first transmission area TA1 in the first optical area OA1 overlaps the first optical electronic device 11, for enabling the first optical electronic device 11 to normally operate, it is necessary to increase a transmittance of the first transmission area TA1 in the first optical area OA1.

To do this, in the display panel 110 of the display device 100 according to aspects of the present disclosure, a transmittance improvement structure (TIS) can be provided to the first transmission area TA1 in the first optical area OA1.

Referring to FIGS. 6 and 7, a plurality of insulating layers included in the display panel 110 may include the buffer layers MBUF, ABUF1, ABUF2 between at least one substrate SUB1, SUB2 and at least one transistor DRT, SCT, the planarization layers PLN1, PLN2 between the transistor DRT and the light emitting element ED, the encapsulation layer ENCAP on the light emitting element ED, and the like.

Referring to FIG. 7, the plurality of insulating layers included in the display panel 110 may further include the touch buffer layer T-BUF and the touch interlayer insulating layer T-ILD located on the encapsulation layer ENCAP, and the like.

Referring to FIGS. 6 and 7, the first transmission area TA1 in the first optical area OA1 may have a structure in which the first planarization layer PLN1 and the passivation layer PAS0 have depressed portions that extend downward from respective surfaces thereof as a transmittance improvement structure (TIS).

Referring to FIGS. 6 and 7, among the plurality of insulating layers, the first planarization layer PLN1 may include at least one depression (or recess, trench, concave, protrusion, etc.). The first planarization layer PLN1 may be, for example, an organic insulating layer.

In a case where the first planarization layer PLN1 has the depressed portion that extends downward from the surfaces thereof, the second planarization layer PLN2 can substantially serve to planarize. In an aspect, the second planarization layer PLN2 may also have a depressed portion that extends downward from the surface thereof. In this case, the second encapsulation layer PCL can substantially serve to planarize.

Referring to FIGS. 6 and 7, the depressed portions of the first planarization layer PLN1 and the passivation layer PAS0 may pass through insulating layers, such as the first interlayer insulating layer ILD, the second interlayer insulating layer ILD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and may extend up to an upper portion of the second substrate SUB2.

Referring to FIGS. 6 and 7, the substrate SUB may include at least one concave portion or depressed portion as a transmittance improvement structure (TIS). For example, in the first transmission area TA1, an upper portion of the second substrate SUB2 may be indented or depressed downward, or the second substrate SUB2 may be perforated.

Referring to FIGS. 6 and 7, the first encapsulation layer PAS1 and the second encapsulation layer PCL included in the encapsulation layer ENCAP may also have a transmittance improvement structure (TIS) in which the first encapsulation layer PAS1 and the second encapsulation layer PCL have depressed portions that extend downward from the respective surfaces thereof. The second encapsulation layer PCL may be, for example, an organic insulating layer.

Referring to FIG. 7, to protect the touch sensor TS, the protective layer PAC may be disposed to cover the touch sensor TS on the encapsulation layer ENCAP.

Referring to FIG. 7, the protective layer PAC may have at least one depression (or recess, trench, concave, protrusion, etc.) as a transmittance improvement structure (TIS) in a portion overlapping the first transmission area TA1. The protective layer PAC may be, for example, an organic insulating layer.

Referring to FIG. 7, the touch sensor TS may include one or more touch sensor metals TSM with a mesh type. In a case where the touch sensor metal TSM is formed in the mesh type, a plurality of openings may be present in the touch sensor metal TSM. Each of the plurality of openings may be located to correspond to the light emitting area EA of the subpixel SP.

In order for the first optical area OA1 to have a transmittance higher than the normal area NA, an area of the touch sensor metal TSM per unit area in the first optical area OA1 may be smaller than an area of the touch sensor metal TSM per unit area in the normal area NA.

Referring to FIG. 7, the touch sensor TS may be disposed in the light emitting area EA in the first optical area OA1, but may not be disposed in the first transmission area TA1 in the first optical area OA1.

Next, a stack structure of the second optical area OA2 will be described with reference to FIGS. 6 and 7.

Referring to FIGS. 6 and 7, a light emitting area EA in the second optical area OA2 may have the same stack structure as that in the normal area NA. Accordingly, in the discussion that follows, instead of repeatedly describing the light emitting area EA in the second optical area OA2, a stacked structure of a second transmission area TA2 in the second optical area OA21 will be described in detail below.

The cathode electrode CE may be disposed in the light emitting areas EA included in the normal area NA and the second optical area OA2, but may not be disposed in the second transmission area TA2 in the second optical area OA2. That is, the second transmission area TA2 in the second optical area OA2 may correspond to an opening of the cathode electrode CE.

Further, the light shield layer LS including at least one of the first metal layer ML1 and the second metal layer ML2 may be disposed in the light emitting areas EA included in the normal area NA and the second optical area OA2, but may not be disposed in the second transmission area TA2 in the second optical area OA2. That is, the second transmission area TA2 in the second optical area OA2 may correspond to an opening of the light shield layer LS.

When the transmittance of the second optical area OA2 and the transmittance of the first optical area OA1 are the same, the stacked structure of the second transmission area TA2 in the second optical area OA2 may be the same as the stacked structure of the first transmission area TA1 in the first optical area OA1.

When the transmittance of the second optical area OA2 and the transmittance of the first optical area OA1 are different, the stacked structure of the second transmission area TA2 in the second optical area OA2 may be different in at least a part from the stacked structure of the first transmission area TA1 in the first optical area OA1.

For example, as shown in FIGS. 6 and 7, when the transmittance of the second optical area OA2 is lower than the transmittance of the first optical area OA1, the second transmission area TA2 in the second optical area OA2 may not have a transmittance improvement structure (TIS). As a result, the first planarization layer PLN1 and the passivation layer PAS0 may not be indented or depressed. Further, a width of the second transmission area TA2 in the second optical area OA2 may be smaller than a width of the first transmission area TA1 in the first optical area OA1.

The substrate SUB1, SUB2, and the various types of insulating layers MBUF, ABUF1, ABUF2, GI, ILD1, ILD2, PAS0, PLN (PLN1, PLN2), BANK, ENCAP (PAS1, PCL, PAS2), T-BUF, T-ILD, PAC disposed in the light emitting areas EA included in the normal area NA and the second optical area OA2 may be disposed in the second transmission area TA2 in the second optical area OA2, equally, substantially equally, or similarly.

However, all or at least a part of one or more material layers having electrical properties (e.g., a metal material layer, a semiconductor layer, etc.), except for the insulating materials or layers, disposed in the light emitting areas EA included in the normal area NA and the second optical area OA2 may not be disposed in the second transmission area TA2 in the second optical area OA2.

For example, referring to FIGS. 6 and 7, all or at least a part of the metal material layers ML1, ML2, GATE, GM, TM, SD1, SD2 related to at least one transistor and the semiconductor layer ACT may not be disposed in the second transmission area TA2 in the second optical area OA2.

Further, referring to FIGS. 6 and 7, the anode electrode AE and the cathode electrode CE included in the light emitting element ED may not be disposed in the second transmission area TA2. In this case, it should be noted that the emissive layer EL of the light emitting element ED may or may not be disposed on the second transmission area TA2 according to a design requirement.

Further, referring to FIG. 7, the touch sensor metal TSM and the bridge metal BRG included in the touch sensor TS may not be disposed in the second transmission area TA2 in the second optical area OA2.

Accordingly, the light transmittance of the second transmission area TA2 in the second optical area OA2 can be provided or improved because the material layers (e.g., the metal material layer, the semiconductor layer, etc.) having electrical properties are not disposed in the second transmission area TA2 in the second optical area OA2. As a consequence, the second optical electronic device 12 can receive light transmitting through the second transmission area TA2 and perform a corresponding function (e.g., approach detection of an object or human body, external illumination detection, etc.).

Figure 8:
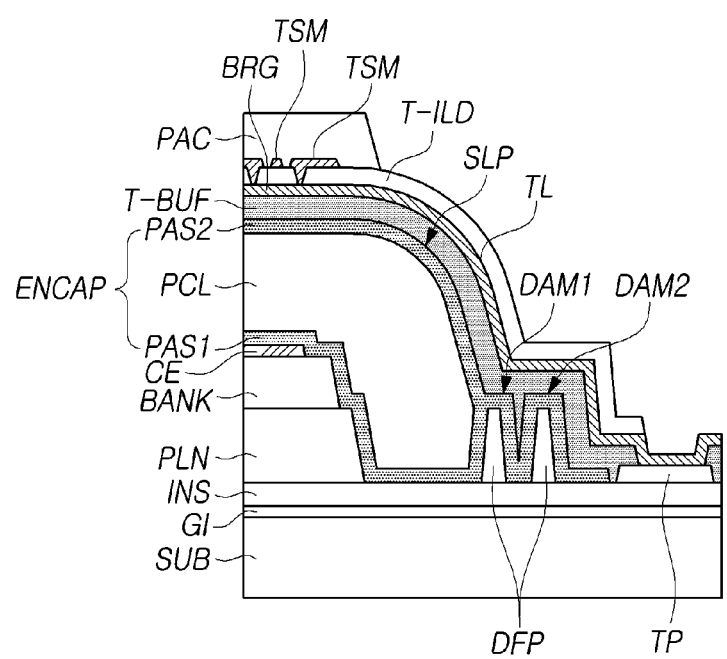
FIG. 8 is a cross-sectional view of an edge of the display panel according to aspects of the present disclosure.

FIG. 8 is a cross-sectional view of an edge of the display panel according to aspects of the present disclosure.

In FIG. 8, a single substrate SUB, which represents the combining of the first substrate SUB1 and the second substrate SUB2, is shown, and layers or portions located under the bank BANK are shown briefly. In FIG. 8, the first planarization layer PLN1 and the second planarization layer PLN2 are represented as one planarization layer PLN, and the second interlayer insulating layer ILD2 and the first interlayer insulating layer ILD1 under the planarization layer PLN are represented as one interlayer insulating layer INS.

Referring to FIG. 8, the first encapsulation layer PAS1 may be disposed on the cathode electrode CE and disposed closest to the light emitting element ED. The second encapsulation layer PCL may have a smaller area than the first encapsulation layer PAS1. In this case, the second encapsulation layer PCL may be disposed to expose both ends or edges of the first encapsulation layer PAS1.

The third encapsulation layer PAS2 may be disposed over the substrate SUB over which the second encapsulation layer PCL is disposed to cover the respective top surfaces and side surfaces of the second encapsulation layer PCL and the first encapsulation layer PAS1.

The third encapsulation layer PAS2 can reduce or prevent external moisture or oxygen from penetrating into the first inorganic encapsulation layer PAS1 and the organic encapsulation layer PCL.

Referring to FIG. 8, in order to prevent the encapsulation layer ENCAP from collapsing, the display panel 110 may include one or more dams DAM1, DAM2 at, or near to, an end or edge of an inclined surface (or slope) SLP of the encapsulation layer ENCAP. The one or more dams DAM1, DAM2 may be present at, or near to, a boundary point between the display area DA and the non-display area NDA.

The one or more dams DAM1, DAM2 may include the same material DFP as the bank BANK.

Referring to FIG. 8, in one aspect, the second encapsulation layer PCL including an organic material may be located only on an inner side of a first dam DAM1, which is located closest to the inclined surface SLP of the encapsulation layer ENCAP. That is, the second encapsulation layer PCL may not be located on all of the dams DAM1, DAM2. In another aspect, the second encapsulation layer PCL including an organic material may be located on at least the first dam DAM1 of the first dam DAM1 and a second dam DAM2.

The second encapsulation layer PCL may extend only up to all, or at least a portion, of an upper portion of the first dam DAM1. In further another aspect, the second encapsulation layer PCL may extend past the upper portion of the first dam DAM1 and extend up to all, or at least a portion of, an upper portion of the secondary dam DAM2.

Referring to FIG. 8, a touch pad TP, to which the touch driving circuit 160 is electrically connected, may be disposed on a portion of the substrate SUB, which corresponds to the outside of the one or more dams DAM1, DAM2.

The touch line TL may electrically connect the touch sensor metal TSM or the bridge metal BRG included in the touch electrode disposed in the display area DA to the touch pad TP.

One end or edge of the touch line TL may be electrically connected to the touch sensor metal TSM or the bridge metal BRG, and the other end or edge of the touch line TL may be electrically connected to the touch pad TP.

The touch line TL may descend along the inclined surface SLP of the encapsulation layer ENCAP, pass through the upper portions of the dams DAM1, DAM2, and extend to the touch pad TP disposed at the outer edge thereof.

Referring to FIG. 8, in one aspect, the touch line TL may be the bridge metal BRG. In another aspect, the touch line TL may be the touch sensor metal TSM.

One or more optical areas OA1 and OA2 overlapping one or more optical electronic devices 11 and 12 may be formed in a pattern in which the light emitting area EA and one or more transmission area TA are repeated.

Figure 9:
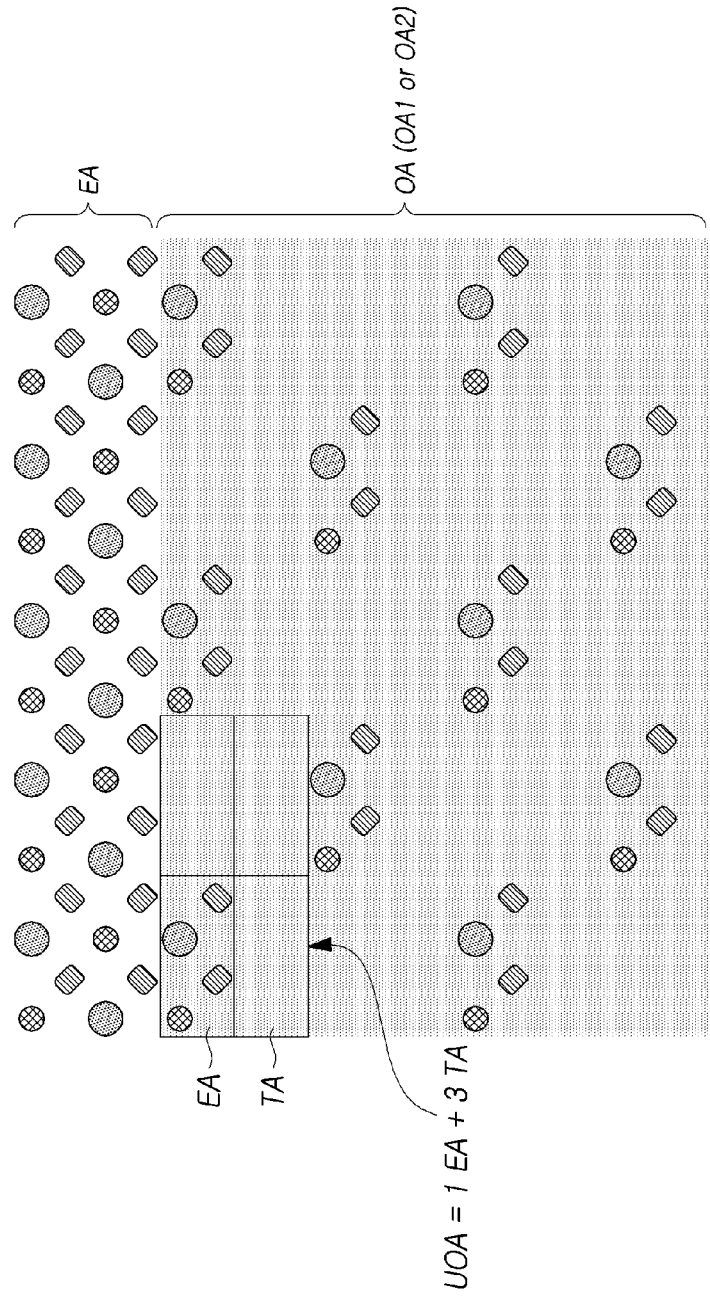
FIG. 9 illustrates a structure of an optical area in which a light emitting area and one or more transmission area are repeated in a display panel according to aspects of the present disclosure.

FIG. 9 illustrates a structure of an optical area in which a light emitting area and one or more transmission area are repeated in a display panel according to aspects of the present disclosure.

Referring to FIG. 9, in the display panel 110 according to aspects of the present disclosure, one or more optical areas OA1 and OA2 overlapping one or more optical devices 11 and 12 may be formed in a pattern in which a unit optical area UOA including the light emitting area EA and the one or more transmission area TA is repeated.

For example, one or more optical areas OA1 and OA2 are repeated in the unit optical area UOA having the same pattern, and the unit optical area UOA may include one light emitting area EA and three transmission areas TA.

In this case, on light emitting area EA included in the unit optical area UOA may correspond to a pixel area including a red subpixel, a green subpixel, a blue subpixel, and a white subpixel.

On the other hand, the three transmission areas TA may not include subpixels SP that emit light. In this case, although the subpixels emitting light are not disposed in the transmission area TA, the transmission area TA may have a size or an area corresponding to the light emitting area EA, and thus the size or area of the transmission area TA may correspond to the pixel area.

When the light emitting area EA and the transmission area TA are physically divided, the structure of the unit optical area UOA may be expressed as a number of the light emitting area EA and the transmission area TA.

In this case, the three transmission areas TA may be disposed adjacent to each other or may be disposed at regular intervals. In addition, each of the three transmission areas TA may have an area corresponding to one light emitting area EA, and in this case, the area occupied by the three transmission areas TA may correspond to three times the area occupied by one light emitting area EA.

Therefore, when it is difficult to physically distinguish the light emitting area EA from the transmission area TA, the structure of the unit optical area UOA may be expressed based on the areas of the light emitting area EA and the transmission area TA.

In this way, when the optical area OA including the light emitting area EA and the transmission area TA is used as the display area DA, image data displayed in the optical area OA may be located in the transmission area TA in the optical area OA.

Figure 10:
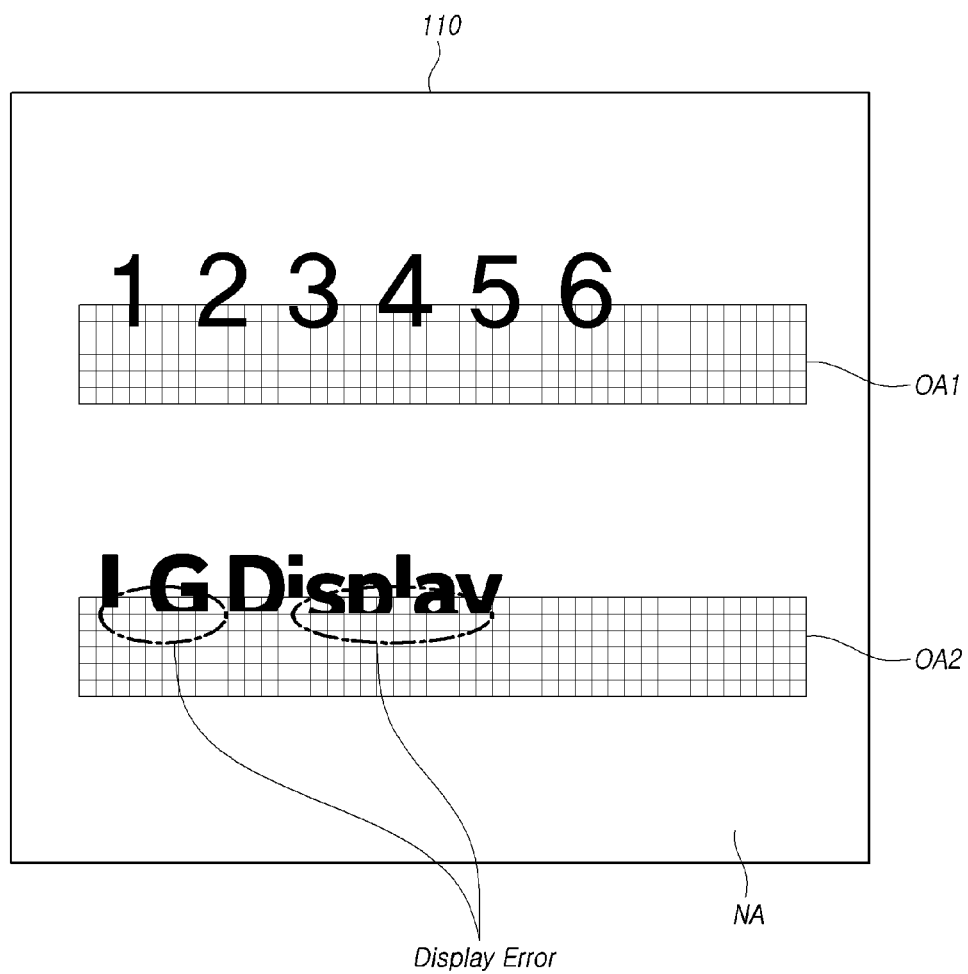
FIG. 10 illustrates an example of a case in which image data is displayed in an optical area on a display panel according to aspects of the present disclosure.

FIG. 10 illustrates an example of a case in which image data is displayed in an optical area on a display panel according to aspects of the present disclosure.

Referring to FIG. 10, when the display panel 110 according to aspects of the present disclosure uses the optical area OA as the display area DA, the image data Data displayed on the display panel 110 may be located in the optical area OA including the light emitting area EA and the transmission area TA.

In this case, a part of the image data Data located in the optical area OA may be located in the transmission area TA in the optical area OA.

In this way, when a part of the image data Data is located in the transmission area TA in the optical area OA, the readability of the image data Data may deteriorate because the quality of the image data Data corresponding to the transmission area TA is not displayed on the display panel 110.

In particular, when the image data Data is formed along the transmission area TA array in the optical area OA, readability may be very poor and the user may not be able to identify the image data Data.

For example, if a unit optical area UOA constituting the optical area OA consists of one light emitting area EA and three transmitting areas TA are located in the upper left corner of the unit optical area UOA, the transmission area TA is distributed along the upper and lower right ends of the unit optical area UOA.

In this case, when the image data Data displayed on the display panel 110 is a straight line extending in a horizontal direction, and the straight line part of the image data is disposed along the lower end of the unit optical area UOA corresponding to the transmission area TA, readability becomes very poor.

In particular, when the image data Data is a character text having a thin width, when the thin character text including a straight line is disposed in the optical area OA, the thin character text is not displayed on the display panel 110 and thus readability may be further degraded. This phenomenon may become more severe when the width of the character text is equal to or smaller than the width of the transmission area OA.

In order to prevent such quality degradation, when the image data Data is located in the optical area OA, the display device 100 of the present disclosure may improve readability by displaying the image data Data along a moving path reflecting the structure of the optical area OA.

Figure 11:
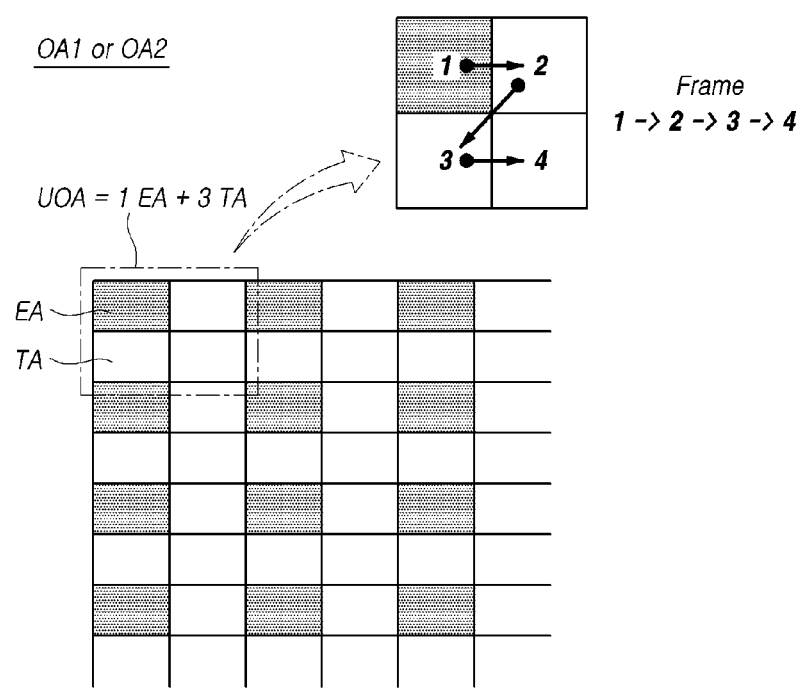
FIG. 11 illustrates a concept of determining a movement path of image data according to a structure of an optical area in a display device according to aspects of the present disclosure as an example.

FIG. 11 illustrates a concept of determining a movement path of image data according to a structure of an optical area in a display device according to aspects of the present disclosure as an example.

Referring to FIG. 11, in the display device 100 according to aspects of the present disclosure, the optical area OA of the display panel 110 may include a plurality of unit optical areas UOA arranged in a predetermined pattern.

The unit optical area UOA may include one or more light emitting areas EA and one or more transmission areas TA, and a movement path of image data Data to be displayed on the screen may be determined according to a structure of the unit optical area UOA.

For example, if the unit optical area UOA is a 2×2 square structure including one light emitting area EA and three transmission areas TA and when the light emitting area TA is located at the upper left, the light emitting area EA may be set to a first position, a transmission area TA on the right side thereof may be set to a second position, a transmission area TA under the light emission area EA may be set to a third position, and a transmission area TA diagonally from the light emission area EA may be set to a fourth position.

In this state, the light emitting area EA is selected as a reference position, and a movement path of the image data Data displayed on the optical area OA may be determined as the frame progresses.

Here, the reference position may correspond to at least one pixel position as a reference for determining a positional relationship of the image data Data displayed in the optical area OA. For example, image data Data displayed in the optical area OA may be represented by light emitting pixels that emit light at a constant luminance among a plurality of pixels including the optical area OA, and positions of the light emitting pixels may be represented by a plurality of pixels spaced by a specific distance from a reference position selected in the optical area OA.

In this case, when the image data Data displayed on the display panel 110 is targeted, one or more arbitrary pixels having a constant luminance in the display panel 110 may be viewed as a reference position. Alternatively, when some image data Data displayed in the optical area OA among the image data Data are targeted, a constant pixel selected from the light emitting area EA and the transmission area TA in the optical area OA may be viewed as a reference position.

That is, in the first frame, the image data Data is displayed based on the first position corresponding to the light emitting area EA, and in the second frame, the image data Data is displayed based on the second position corresponding to the right side of the light emitting area EA. In the third frame, image data Data is displayed based on the third position corresponding to a lower part of the light emitting area EA, and in the fourth frame, image data Data is displayed based on the fourth position corresponding to a diagonal part of the light emitting area EA.

In this case, a movement path in which image data Data is displayed in the optical area OA may be determined in consideration of a direction of a gate signal and a data voltage Vdata applied to the display panel 110.

That is, when a gate signal is applied from the left to the right of the display panel 110 and a data voltage Vdata is applied from the top to the bottom of the display panel 110, a movement path of the image data displayed on the optical area OA may be set from the left to the right and from the top to the bottom.

In the case of the unit optical area UOA having a 2×2 square structure, the light emitting area EA may be displayed on the first frame with respect to the first position on the upper left, the second frame may be moved to the second position on the right, the third frame may be moved to the third position on the lower left, and the fourth frame may be moved to the fourth position on the right again.

Figure 12:
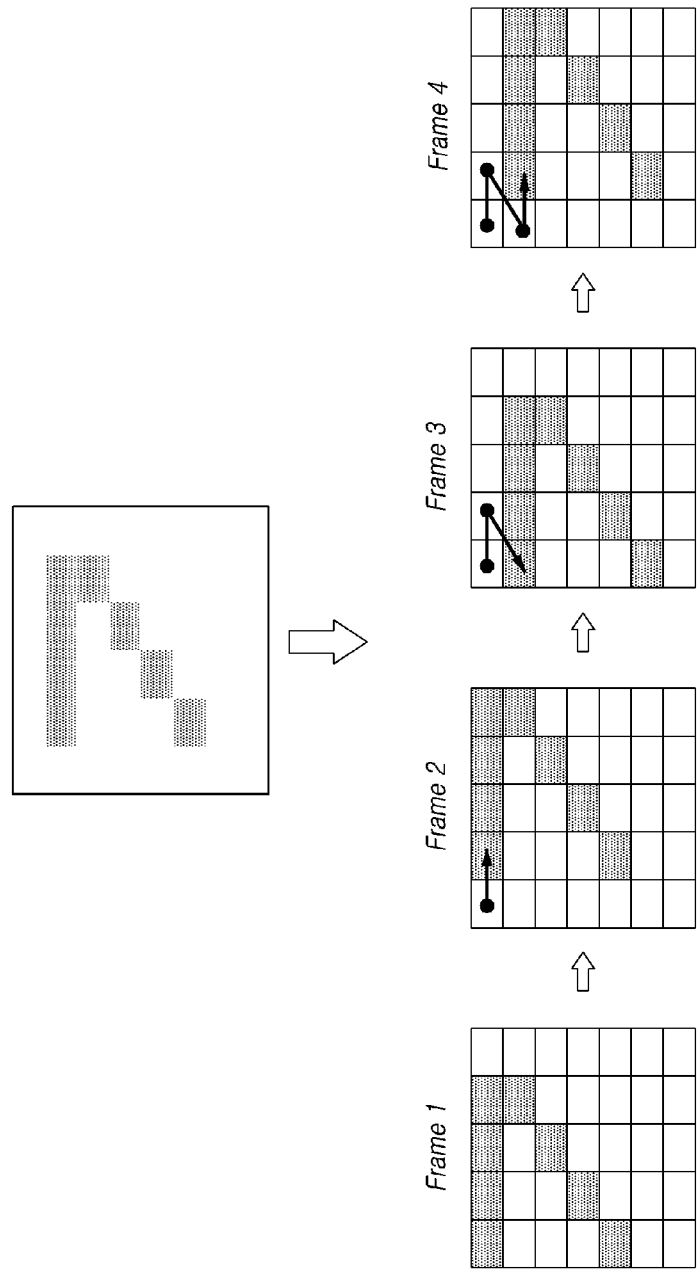
FIG. 12 illustrates a path through which image data moves according to a frame in a display device according to aspects of the present disclosure.
Figure 13:
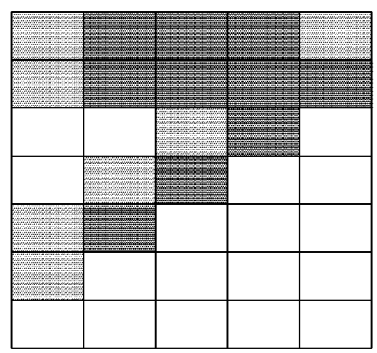
FIG. 13 illustrates an image recognized by a user when image data is displayed according to a movement path of FIG. 12 in a display device according to aspects of the present disclosure.

FIG. 12 illustrates a path through which image data moves according to a frame in a display device according to aspects of the present disclosure, and FIG. 13 illustrates an image recognized by a user when image data is displayed according to a movement path of FIG. 12 in a display device according to aspects of the present disclosure.

Referring to FIGS. 12 and 13, at least a part of image data Data displayed on the display panel 110 of the display device 100 according to aspects of the present disclosure may be located in the optical area OA.

When at least a part of the image data Data is located in the optical area OA, a path in which the image data Data is displayed may be moved according to a frame according to a structure of the unit optical area UOA.

When the unit optical area UOA is a 2×2 square structure including one light emitting area EA and three transmission areas TA, and the light emitting area EA is located at the upper left, the unit optical area UOA may be divided into four areas.

In this case, the image data Data may be displayed at a location by reflecting a movement path for each frame during four frames.

That is, the image data Data may be displayed on the first frame based on the first position at the upper left, may move to the second position which is right from the reference position on the second frame, may move to the third position which is lower left from the second position on the third frame, and may move to the fourth position which is right from the third position on the fourth frame.

When the image data Data is displayed in the optical area OA according to the movement path, a part that is difficult to recognize by the transmission area TA is also displayed in the light emitting area EA, and thus readability of the image data Data located in the optical area OA may be improved.

The display device 100 of the present disclosure may improve readability by determining a movement path of the image data Data by reflecting a structure of various optical areas OA.

Figure 14:
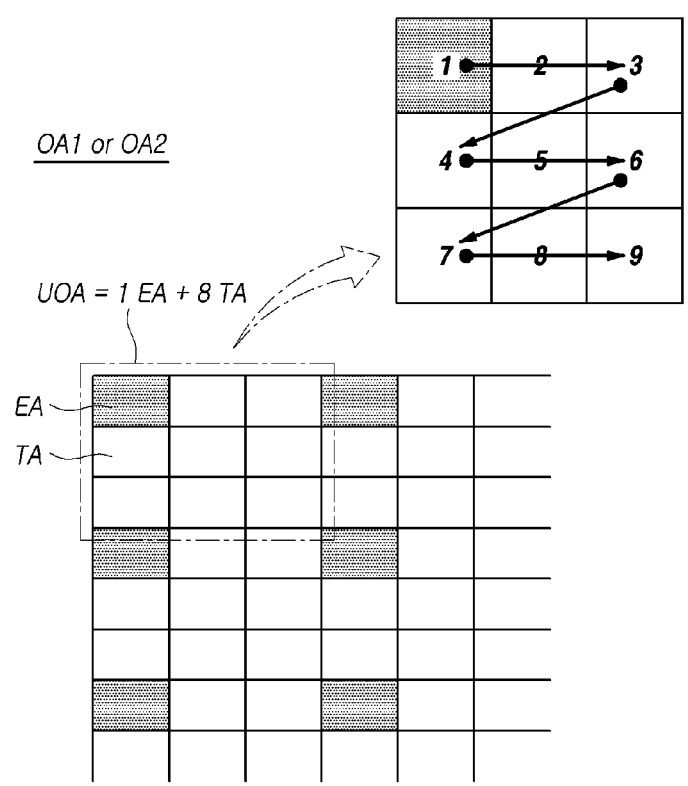
FIG. 14 illustrates a concept of determining a movement path of image data by reflecting a structure of an optical area including one light emitting area and eight transmission areas in a display device according to aspects of the present disclosure.

FIG. 14 illustrates a concept of determining a movement path of image data by reflecting a structure of an optical area including one light emitting area and eight transmission areas in a display device according to aspects of the present disclosure.

Referring to FIG. 14, in the display device 100 according to aspects of the present disclosure, the optical area OA of the display panel 110 may include a plurality of unit optical areas UOA arranged in a predetermined pattern.

The unit optical area UOA may include one or more light emitting areas EA and one or more transmission areas TA, and a movement path of image data Data to be displayed on the screen may be determined according to a structure of the unit optical area UOA.

For example, if the unit optical area UOA is a 3×3 square structure including one light emitting area EA and eight transmission areas TA, and when the light emitting area EA is located at the upper left, the light emitting area EA may be set to a first position, the transmission area TA on the right side of the light emitting area EA may be set to a second position and a third position sequentially, and the transmission area TA on the lower row of the light emitting area EA may be set to a fourth position, a fifth position, and a sixth position from the left. In addition, the transmission area TA in the last row may be set from the left to a seventh position, an eighth position, and a ninth position.

In this state, the movement path of the image data Data displayed on the optical area OA may be determined as the frame progresses with the light emitting area EA as a reference position.

That is, the image data Data is displayed based on the first position corresponding to the light emitting area EA in the first frame, the image data Data is displayed based on the second position corresponding to the right side of the light emitting area EA in the second frame, and the image data is displayed based on the third position corresponding to the right side of the second position in the third frame.

Image data Data are sequentially displayed based on the fourth to sixth positions positioned in the lower row of the light emitting area EA in the fourth to sixth frames, and image data Data are sequentially displayed based on seventh to ninth positions positioned in the lowest row in the seventh to ninth frames.

In this case, a movement path in which image data Data is displayed in the optical area OA may be determined in consideration of a direction of a gate signal and a data voltage Vdata applied to the display panel 110.

That is, when a gate signal is applied from the left side to the right side of the display panel 110 and a data voltage Vdata is applied from the upper side to the lower side of the display panel 110, a movement path of the image data Data displayed on the optical area OA may be set from the left to the right and from the top to the bottom.

Figure 15:
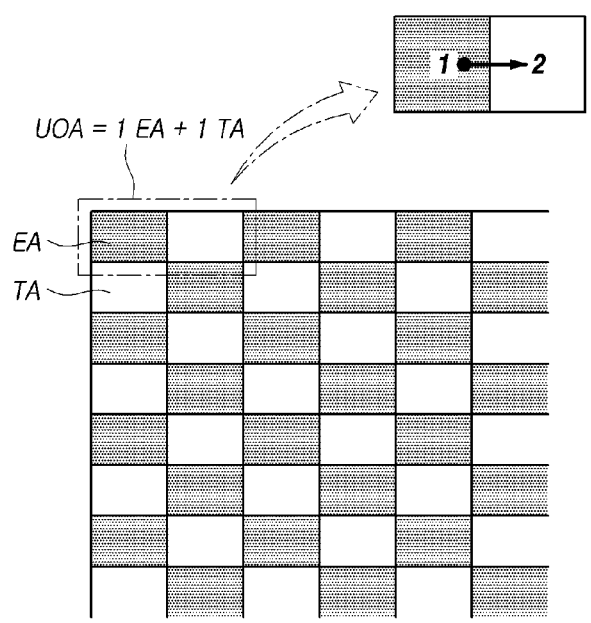
FIG. 15 illustrates a concept of determining a movement path of image data by reflecting a structure of an optical area including one light emitting area and one transmission area in a display device according to aspects of the present disclosure.

FIG. 15 illustrates a concept of determining a movement path of image data by reflecting a structure of an optical area including one light emitting area and one transmission area in a display device according to aspects of the present disclosure.

Referring to FIG. 15, in the display device 100 according to aspects of the present disclosure, the optical area OA of the display panel 110 may include a plurality of unit optical areas UOA arranged in a predetermined pattern.

The unit optical area UOA may include one or more light emitting areas EA and one or more transmission areas TA, and a movement path of image data Data to be displayed on the screen may be determined according to a structure of the unit optical area UOA.

For example, if the unit optical area UOA has a structure of 1×2 including one light emitting area EA and one light transmission area TA, and when the light emitting area EA is located on the left side, the light emitting area EA may be set to a first position and the transmission area TA on the right side of the light emitting area EA may be set to a second position.

In this state, the movement path of the image data Data displayed on the optical area OA may be determined as the frame progresses with the light emitting area EA as a reference position.

That is, the image data Data is displayed based on the first position corresponding to the light emitting area EA in the first frame, and the image data Data is displayed based on the second position corresponding to the right side of the light emitting area EA in the second frame.

In this case, a movement path in which image data Data is displayed in the optical area OA may be determined in consideration of a direction of a gate signal applied to the display panel 110.

That is, when the gate signal is applied from the left side to the right side of the display panel 110, the movement path of the image data displayed on the optical area OA may be set from the left side to the right side.

Meanwhile, in order to improve readability of the image data Data displayed on the optical area OA, the display device 100 of the present disclosure may set the number of times the image data Data is displayed based on the light emitting area EA to be greater than the number of times the image data is displayed based on the transmission area TA.

Figure 16:
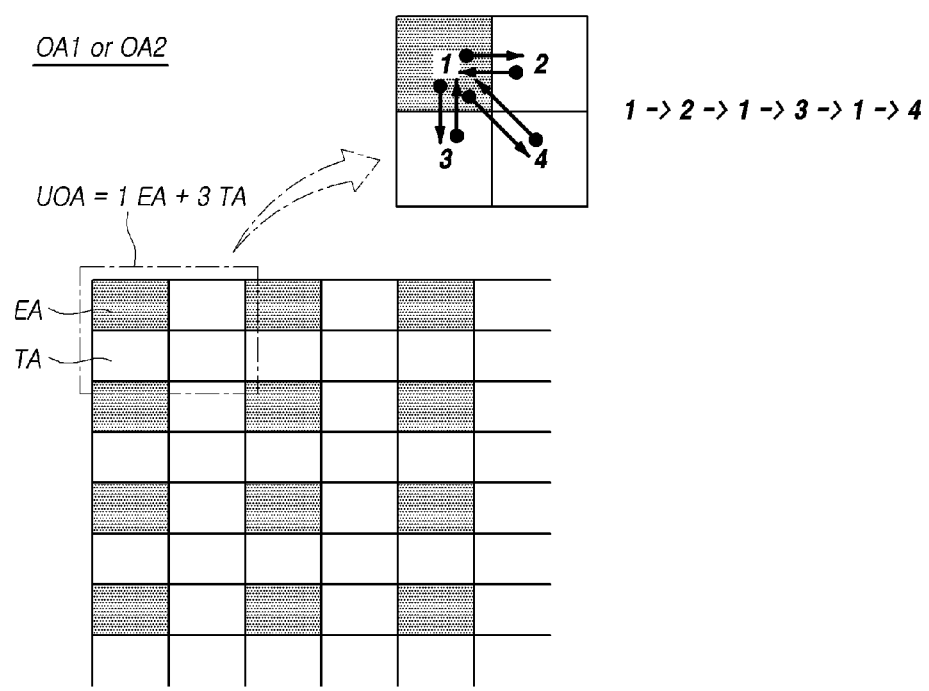
FIG. 16 illustrates another example of determining a movement path of image data according to a structure of an optical area in a display device according to aspects of the present disclosure.

FIG. 16 illustrates another example of determining a movement path of image data according to a structure of an optical area in a display device according to aspects of the present disclosure.

Referring to FIG. 16, in the display device 100 according to aspects of the present disclosure, the optical area OA of the display panel 110 may include a plurality of unit optical areas UOA arranged in a predetermined pattern.

The unit optical area UOA may include one or more light emitting areas EA and one or more transmission areas TA, and a movement path of image data Data to be displayed on the screen may be determined according to a structure of the unit optical area UOA.

For example, if the unit optical area UOA is a 2×2 square structure including one light emitting area EA and three transmission areas TA and when the light emitting area TA is located at the upper left, the light emitting area EA may be set to a first position, a transmission area TA on the right side thereof may be set to a second position, a transmission area TA under the light emission area EA may be set to a third position, and a transmission area TA diagonally from the light emission area EA may be set to a fourth position.

In this state, the light emitting area EA is selected as a reference position, and a movement path of the image data Data displayed on the optical area OA may be determined as the frame progresses.

In this case, in order to improve readability of the image data Data displayed on the optical area OA, the number of times of displaying the image data Data based on the light emitting area EA may be set to be greater than the number of times of displaying the image data Data based on the transmission area TA.

That is, the image data Data is displayed based on the first position corresponding to the light emitting area EA in the first frame, and the image data Data is displayed based on the second position corresponding to the right side of the light emitting area EA in the second frame.

Then, the image data Data is displayed based on the first position corresponding to the light emitting area EA again in the third frame, and the image data Data is displayed based on the third position corresponding to the lower position of the light emitting area EA in the fourth frame.

The image data Data is displayed based on the first position corresponding to the light emitting area EA again in the fifth frame, and the image data Data is displayed based on the fourth position corresponding to the diagonal lower of the light emitting area EA in the sixth frame.

In this way, by setting the number of times the image data Data is displayed based on the light emitting area EA to be greater than the number of times the image data Data is displayed based on the transmission area TA, the image data Data may be displayed more frequently on the light emitting area EA.

Figure 17:
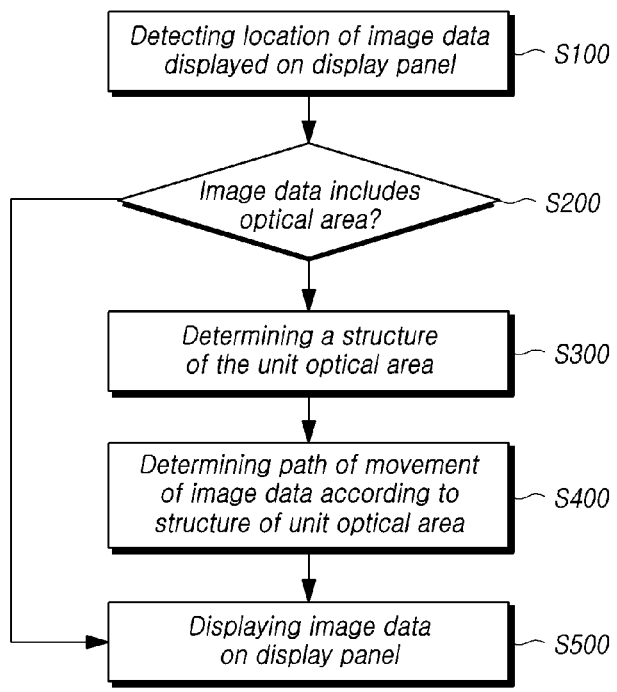
FIG. 17 is a flowchart illustrating a method of driving a display according to aspects of the present disclosure.

FIG. 17 is a flowchart illustrating a method of driving a display according to aspects of the present disclosure.

Referring to FIG. 17, the display driving method according to aspects of the present disclosure may include a step S100 of detecting position of image data Data displayed on the display panel 110, a step S200 of determining whether the image data Data includes an optical area OA, a step S300 of confirming the structure of the unit optical area UOA, a step S400 of determining a movement path of the image data Data according to a structure of the unit optical area UOA, and a step S500 of displaying the image data Data on the display panel 110.

The step S100 of detecting the position of the image data displayed on the display panel 110 is a process of checking the position of the image data Data on the display panel 110, transferred from the host system 200.

The display controller 140 may temporarily store image data Data transmitted from the host system 200 in a memory, and may check a position where the image data Data is displayed on the display panel 110 before supplying the image data Data to the data driving circuit 130.

The step S200 of determining whether the image data includes the optical area OA is a step of comparing the position of the image data Data with the position of the optical area OA in the display controller 140 to determine whether the image data is displayed in the optical area OA.

In this case, even if the area in which the image data Data is displayed includes the optical area OA, when the image data Data located in the optical area OA is only a part, it may not be difficult for the user to recognize the image data Data.

On the other hand, when the image data Data is consisting of character text having a thin width and the character text having a thin width is arranged in a straight line in the optical area OA, readability may be particularly deteriorated. This phenomenon may become more severe when the width of the character text is equal to or smaller than the width of the transmission area TA.

Therefore, it may be determined whether image data Data consisting of character text having a thin width is arranged in a straight line in the optical area OA, and only in this case, a movement path of the image data may be determined in units of frames.

When the area where the image data Data is displayed includes the optical area OA, the step S300 of checking the structure of the unit optical area UOA is a process of checking the structure of the unit optical area UOA constituting the optical area OA of the display panel 110.

In this case, the structure of the unit optical area UOA may be confirmed from information input during a manufacturing process of the display panel 110, or may be determined by checking the arrangement of the light emitting area EA and the transmission area TA included in the optical area OA.

The step S400 of determining a movement path of the image data Data according to a structure of the unit optical area UOA is a process of determining a movement path of the image data Data in units of frames so that the display controller 140 may reflect the structure of the unit optical area UOA and improve readability to the image data Data.

In this case, the display controller 140 may determine a movement path to move the entire image data Data displayed on the display panel 110 in units of frames. Alternatively, the moving path may be determined to fix the image data portion located in the normal area NA among the entire image data Data displayed on the display panel 110 and select only the image data portion located in the optical area OA to move in units of frames.

The step S500 of displaying the image data Data on the display panel 110 is a process of controlling the image data Data to be displayed at a fixed position when the image data Data does not include the optical area OA, but when the image data includes the optical area OA, the image data is displayed according to a movement path determined by frame.

As described above, when the image data Data is located in the optical area OA, the display device 100 of the present disclosure may improve readability by displaying the image data Data according to a moving path reflecting the structure of the optical area OA.

The aspects of the present disclosure described above will be briefly described below.

The display device 100 according to the aspects of the present disclosure comprises a display panel 110 in which an optical area OA and a normal area NA outside the optical area OA are formed in a display area DA wherein the optical area OA is divided into a transmission area TA and a light emitting area EA and wherein the normal area NA comprises a plurality of light emitting areas EA, a gate driving circuit 120 configured to supply a gate signal to the display panel 110, a data driving circuit 130 configured to convert an image data Data into a data voltage Vdata and supply it to the display panel 110, a display controller 140 configured to control a movement path of the image data Data so that at least a part of the image data Data moves over time according to a structure of the optical area OA when an area where the image data Data is displayed includes the optical area OA.

The structure of the optical area OA is determined based on the structure of the unit optical area UOA consisting of a same pattern.

The structure of the optical area OA is determined based on a number of the light emitting area EA and a number of the transmission area TA.

The structure of the optical area OA is determined based on an area of the light emitting area EA and an area of the transmission area TA.

The movement path of the image data Data is controlled to change a reference position displaying the image data Data in a frame unit in the light emitting area EA and the transmission area TA included in the unit optical area UOA.

The movement path of the image data Data is controlled to change the reference position displaying the image data Data in the light emitting area EA and the transmission area TA included in the unit optical area UOA once in the frame unit.

The movement path of the image data Data is controlled that a number of times that the reference position displaying the image data Data corresponds to the light emitting area EA included in the unit optical area UOA is greater than a number of times that the reference position corresponds to the transmission area TA included in the unit optical area UOA.

The movement path of the image data Data is determined by reflecting a direction in which the gate signal and the data voltage Vdata are applied.

The movement path of the image data Data is controlled that an image data portion located in the normal area NA is fixed and an image data portion located in the optical area OA is moved.

The display device 100 further includes a memory (not shown) configured to store information of the structure of the optical area OA.

A display driving method according to the aspects of the present disclosure for driving a display panel 110 in which an optical area OA and a normal area NA outside the optical area OA are formed in a display area DA wherein the optical area OA is divided into a transmission area TA and a light emitting area EA and wherein the normal area NA comprises a plurality of light emitting areas EA comprises a step S100 of detecting a position of an image data Data displayed on the display panel 110, a step S200 of determining whether an area in which the image data Data is displayed includes the optical area OA, a step S300 of confirming a structure of the optical area OA, when the area in which the image data Data is displayed includes the optical area OA, a step S400 of determining a movement path of the image data Data according to the structure of the optical area OA, a step S500 of displaying the image data Data on the display panel 110 according to the movement path of the image data Data.

The step S200 of determining whether the area in which the image data Data is displayed includes the optical area OA, determines whether the image data Data consists of a thin-width character text and the thin-width character text is placed in a straight line in the optical area OA.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device comprising:
   a display panel in which an optical area including a plurality of unit optical area and a normal area outside the optical area are formed in a display area, wherein each of the unit optical area includes a plurality of transmission areas and one light emitting area, and the normal area includes a plurality of light emitting areas; and
   a display controller configured to control a movement path of an image data so that the image data is displayed based on a first position corresponding to the light emitting area of the unit optical area in a first frame, the image data is displayed based on a second position corresponding to a first transmission area of the unit optical area in a second frame, the image data is displayed based on a first position corresponding to the light emitting area of the unit optical area in a third frame, and the image data is displayed based on a third position corresponding to a second transmission area of the unit optical area in a fourth frame.

2. The display device according to claim 1, further comprising a transmittance improvement structure disposed in the transmission area in the optical area.

3. The display device according to claim 2, further comprising:
   a passivation layer disposed in the optical area and the normal area; and
   a planarization layer disposed on the passivation layer, wherein the transmittance improvement structure includes depressed portions extended downward from surfaces of the passivation layer and the planarization layer.

4. The display device according to claim 1, wherein the optical area is formed by repeating the unit optical area of the same pattern.

5. The display device according to claim 1, further comprising:
   a gate driving circuit configured to supply a gate signal to the display panel; and
   a data driving circuit configured to convert the image data into a data voltage and supply it to the display panel, wherein the movement path of the image data is determined by reflecting a direction in which the gate signal and the data voltage are applied.

6. The display device according to claim 1, wherein the movement path of the image data is controlled that an image data portion located in the normal area is fixed and an image data portion located in the optical area is moved.

7. The display device according to claim 1, further comprising a memory configured to store information of the structure of the optical area.

8. A display driving method for driving a display panel in which an optical area including a plurality of unit optical area and a normal area outside the optical area are formed in a display area, wherein each of the optical area includes a plurality of transmission areas and one light emitting area and the normal area includes a plurality of light emitting areas, the method comprising:
   a step of detecting a position of an image data displayed on the display panel;
   a step of determining whether an area in which the image data is displayed includes the optical area;
   a step of confirming a structure of the unit optical area, when the area in which the image data is displayed includes the optical area;
   a step of displaying the image data based on a first position corresponding to the light emitting area of the unit optical area in a first frame;
   a step of displaying the image data based on a second position corresponding to a first transmission area of the unit optical area in a second frame;
   a step of displaying the image data based on a first position corresponding to the light emitting area of the unit optical area in a third frame; and
   a step of displaying the image data based on a third position corresponding to a second transmission area of the unit optical area in a fourth frame.

9. The display driving method according to claim 8, wherein the step of determining whether the area in which the image data is displayed includes the optical area determines whether the image data consists of a thin-width character text and the thin-width character text is placed in a straight line in the optical area.

10. The display driving method according to claim 9, wherein the step of determining whether the area in which the image data is displayed includes the optical area further determines whether a width of the thin-width character text is equal to or smaller than a width of the transmission area.

* * * * *